United States Patent
Nakajima et al.

(10) Patent No.: US 9,586,760 B2
(45) Date of Patent: Mar. 7, 2017

(54) ELECTRONIC COMPONENT TRANSFER SHUTTLE

(71) Applicant: ADVANTEST CORPORATION, Nerima-ku, Tokyo (JP)

(72) Inventors: Haruki Nakajima, Saitama (JP); Hiroyuki Kikuchi, Gunma (JP); Tsuyoshi Yamashita, Gunma (JP)

(73) Assignee: ADVANTEST CORPORATION, Tokyo (JP)

( * ) Notice: Subject to any disclaimer, the term of this patent is extended or adjusted under 35 U.S.C. 154(b) by 0 days.

(21) Appl. No.: 14/609,976

(22) Filed: Jan. 30, 2015

(65) Prior Publication Data

US 2015/0203300 A1    Jul. 23, 2015

Related U.S. Application Data

(63) Continuation of application No. 13/724,234, filed on Dec. 21, 2012.

(30) Foreign Application Priority Data

Dec. 28, 2011    (JP) ................................. 2011-289392

(51) Int. Cl.
*B65G 47/00* (2006.01)
*B65G 17/12* (2006.01)
(Continued)

(52) U.S. Cl.
CPC ......... *B65G 17/12* (2013.01); *G01R 31/2893* (2013.01); *B65G 35/06* (2013.01)

(58) Field of Classification Search
CPC .................. B65G 17/12; B65G 35/06
(Continued)

(56) References Cited

U.S. PATENT DOCUMENTS 3,204,756 A * 9/1965 Hans Lesch ............ B65B 41/04
104/172.1
3,430,780 A * 3/1969 Rogers ..................... B65G 7/06
414/676

(Continued)

FOREIGN PATENT DOCUMENTS

CN    101033041 A    9/2007
CN    101636334 A    1/2010
(Continued)

OTHER PUBLICATIONS

China Office action, mail date is May 11, 2015.
(Continued)

*Primary Examiner* — William R Harp
(74) *Attorney, Agent, or Firm* — Greenblum & Bernstein, P.L.C.

(57) ABSTRACT

There is provided an electronic device transfer apparatus which has an excellent capacity of transferring DUTs between trays.
An electronic device transfer apparatus, which transfers DUTs between trays, includes a device conveying unit. The device conveying unit includes a plurality of shuttles which hold the DUTs, an endless first guide rail which guides the shuttles, and first to third feeders which move the shuttles on the first guide rail. The shuttles are movable on the first guide rail over the entire circumference of the rail.

12 Claims, 15 Drawing Sheets

(51) Int. Cl.
*G01R 31/28* (2006.01)
*B65G 49/06* (2006.01)
*B65G 35/06* (2006.01)

(58) Field of Classification Search
USPC ...... 198/345.1–345.3, 465.1, 803.3; 414/676
See application file for complete search history.

(56) References Cited

U.S. PATENT DOCUMENTS

| | | | |
|---|---|---|---|
| 3,648,852 A * | 3/1972 | Willuweit | B65G 51/03 104/23.2 |
| 4,502,585 A * | 3/1985 | Sticht | B23Q 7/1426 198/345.3 |
| 4,667,804 A * | 5/1987 | Dubuit | B41F 15/0872 198/345.3 |
| 5,170,876 A * | 12/1992 | Sticht | B23Q 1/262 198/345.3 |
| 5,244,143 A | 9/1993 | Ference et al. | |
| 5,535,873 A | 7/1996 | Sakamoto et al. | |
| 5,639,203 A * | 6/1997 | Lee | H05K 13/0482 414/416.02 |
| 6,043,667 A * | 3/2000 | Cadwallader | G01R 31/2887 324/750.19 |
| 7,371,078 B2 | 5/2008 | Ito et al. | |
| 7,612,575 B2 | 11/2009 | Ito et al. | |
| 7,800,393 B2 | 9/2010 | Ito et al. | |
| 7,919,974 B2 | 4/2011 | Yamashita et al. | |
| 9,069,010 B2 * | 6/2015 | Nakajima | G01R 1/067 |
| 2004/0154161 A1 | 8/2004 | Aoyama et al. | |
| 2007/0212174 A1 | 9/2007 | Hayashi et al. | |
| 2008/0005895 A1 | 1/2008 | Aoyama et al. | |
| 2008/0038098 A1 | 2/2008 | Ito et al. | |
| 2008/0042667 A1 | 2/2008 | Yamashita et al. | |
| 2009/0033352 A1 | 2/2009 | An et al. | |
| 2010/0034631 A1 | 2/2010 | Klaiber et al. | |
| 2010/0148793 A1 | 6/2010 | Ito et al. | |
| 2011/0126931 A1 | 6/2011 | Ide et al. | |
| 2011/0165316 A1 | 7/2011 | Baccini | |
| 2011/0254945 A1 | 10/2011 | Kikuchi et al. | |
| 2013/0169303 A1 * | 7/2013 | Yamashita | G01R 1/0466 324/750.25 |
| 2013/0169304 A1 | 7/2013 | Nakajima | |

FOREIGN PATENT DOCUMENTS

| | | |
|---|---|---|
| JP | 63-241944 | 10/1988 |
| JP | 02-107432 U | 8/1990 |
| JP | 05-055328 | 3/1993 |
| JP | 05-55083 U | 7/1993 |
| JP | 07-14647 U | 3/1995 |
| JP | 07-014647 U | 3/1995 |
| JP | 07-086376 | 3/1995 |
| JP | 07-231026 A | 8/1995 |
| JP | 08-213794 A | 8/1996 |
| JP | 2001-228206 | 8/2001 |
| JP | 2003-185703 A | 7/2003 |
| JP | 2006-337044 | 12/2006 |
| JP | 2008-164595 | 7/2008 |
| JP | 2010-014632 | 1/2010 |
| JP | 2010-98126 A | 4/2010 |
| JP | 2010-510943 | 4/2010 |
| JP | 2011-523224 | 8/2011 |
| KR | 10-2000-0037636 | 7/2000 |
| TW | 533317 B | 5/2003 |
| TW | I284740 B | 8/2007 |
| TW | I322647 B | 3/2010 |
| TW | 201022112 A | 6/2010 |
| WO | 2006/009253 | 1/2006 |
| WO | 2006/009282 | 1/2006 |
| WO | 2008/041334 | 4/2008 |
| WO | 2009/017495 | 2/2009 |
| WO | 2009/144790 A1 | 12/2009 |
| WO | 2010/137137 | 12/2010 |

OTHER PUBLICATIONS

Korea Office action, mail date is Dec. 5, 2013.
Japan Office action, dated May 27, 2014 along with an english translation thereof.
Taiwan Office action for TW 101141093, dated May 22, 2014 along with an English-language translation thereof.
China Office action, mail date is Sep. 30, 2014.
Office Action issued in Taiwan family member Patent Appl. No. 104102489, dated Apr. 27, 2016 , along with an English translation thereof.
Office Action issued in Japanese family member Patent Appl. No. 2015-000988, dated Mar. 29, 2016, along with an English translation thereof.
Office Action issued in Japan Family member Patent Appl. No. 2015-000988, dated Dec. 22, 2015 , along with an English translation thereof.
Office Action issued in Taiwanese family member Patent Appl. No. 104102489, dated Nov. 24, 2016 , along with an English translation thereof.

* cited by examiner

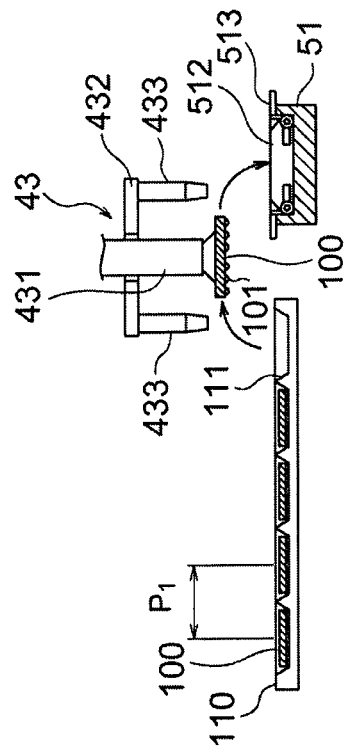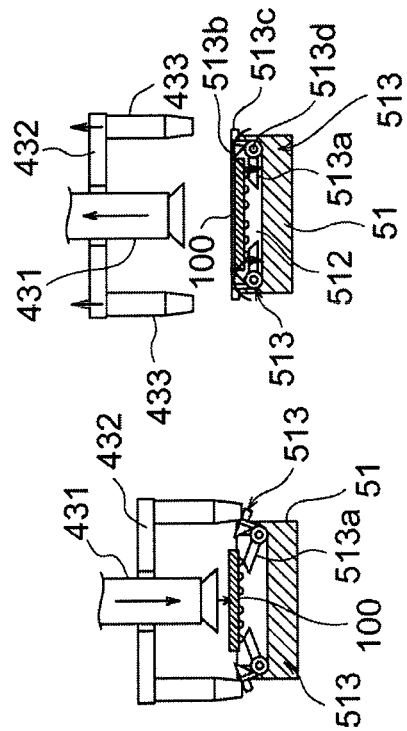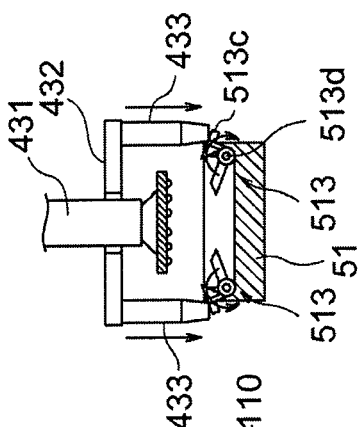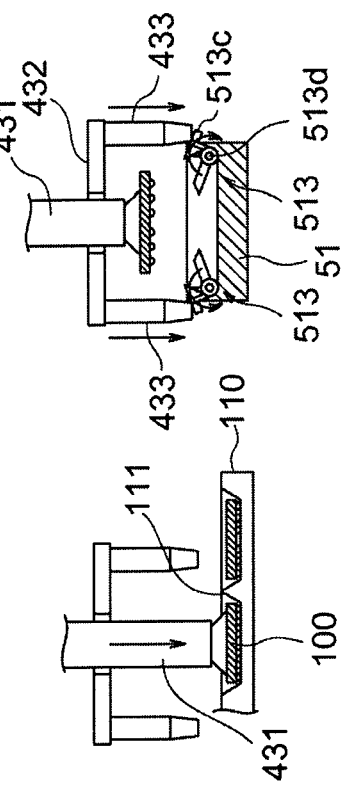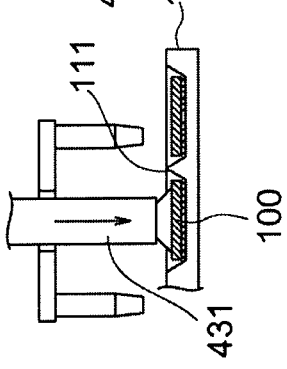

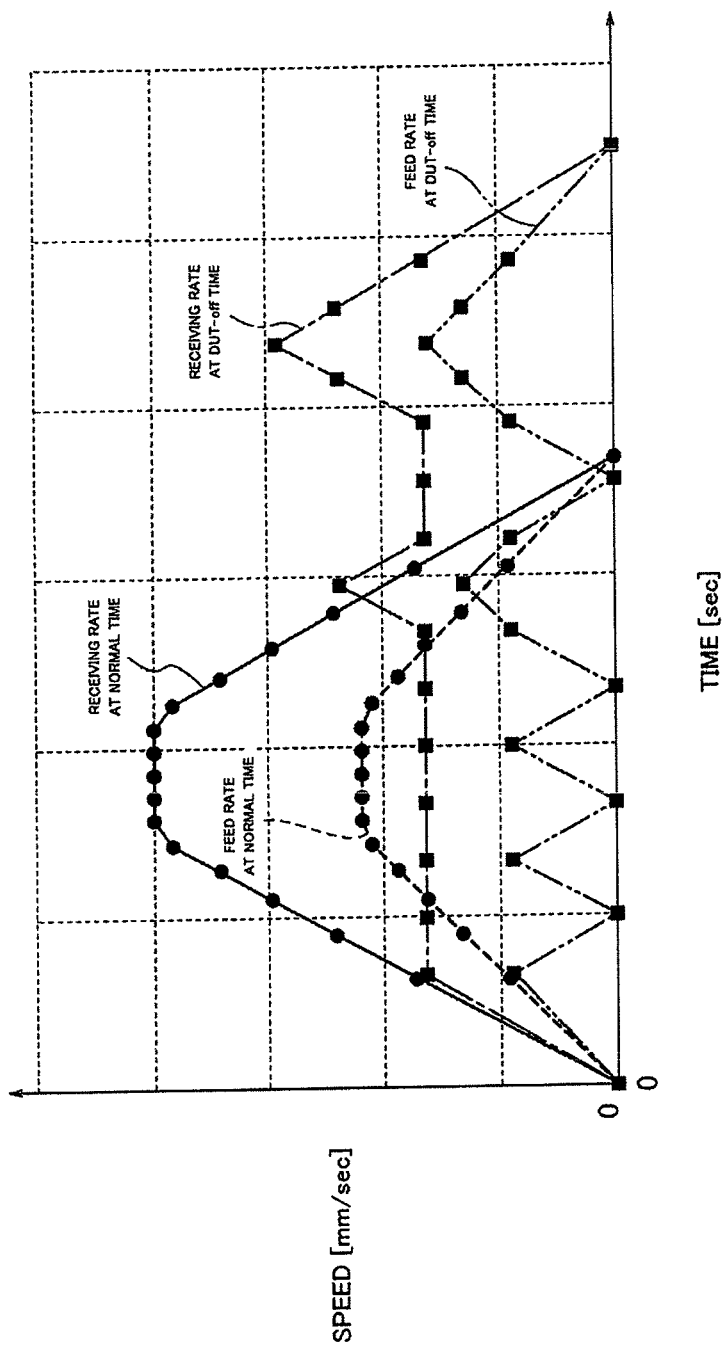

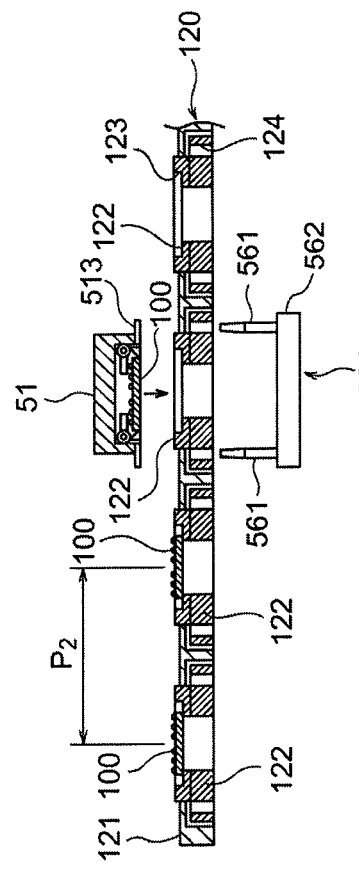
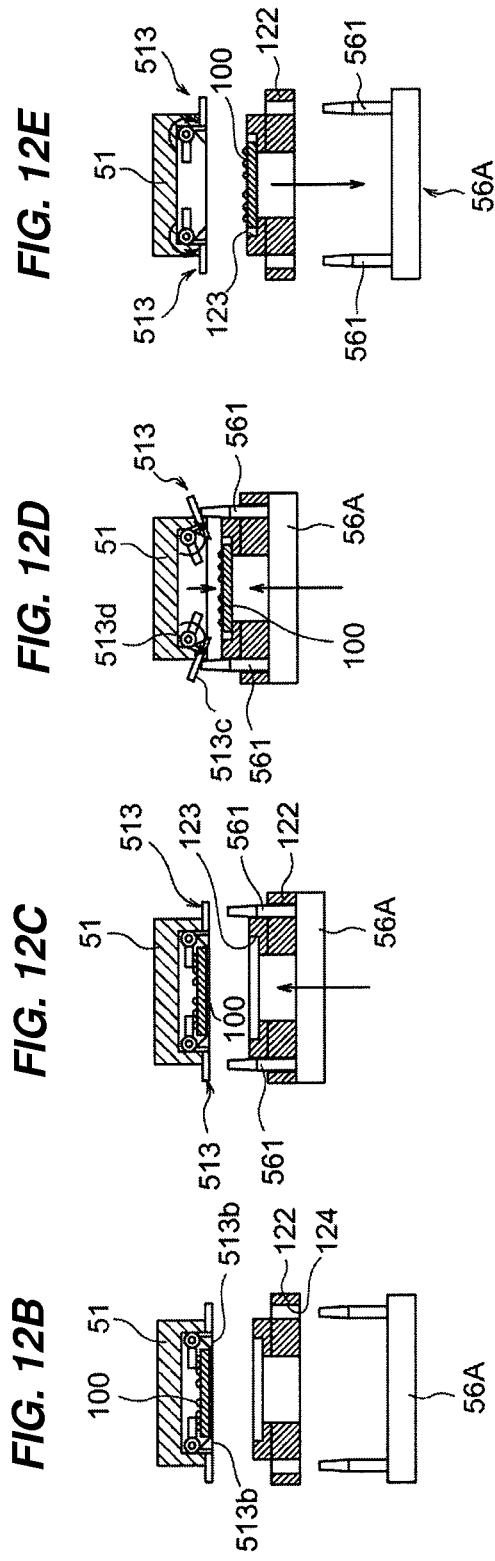

ELECTRONIC COMPONENT TRANSFER SHUTTLE

CROSS-REFERENCE TO RELATED APPLICATION

This is a continuation application of U.S. patent application Ser. No. 13/724,234, filed Dec. 21, 2012, which claims the benefit of Japanese Patent Application No. 2011-289392, filed on Dec. 28, 2011. The disclosure of each of the above-identified applications, including the specification, drawings, and claims, is incorporated herein by reference in its entirety.

BACKGROUND OF THE INVENTION

1. Field of the Invention

The present invention relates to an electronic device transfer apparatus which transfers electronic devices between trays in an electronic device testing apparatus which tests various electronic devices such as semiconductor integrated circuit elements (hereinafter, also referred to as DUTs (Devices Under Test)), an electronic device handling apparatus and the electronic device testing apparatus which include the same.

The present application claims priority from Japanese Patent Application No. 2011-289392 filed on Dec. 28, 2011. The contents described and/or illustrated in the documents relevant to the Japanese Patent Application No. 2011-289392 will be incorporated herein by reference as a part of the description and/or drawings of the present application.

2. Description of the Related Art

An apparatus, which transfers DUTs between a customer tray and a test tray before and after a test, is known as an electronic device testing apparatus which tests electronic devices (for example, see International Publication No. WO 2008/041334).

Since DUTs are transferred between trays by a so-called pick-and-place unit in the electronic device testing apparatus, the transfer capacity of the electronic device testing apparatus is limited.

SUMMARY OF THE INVENTION

An object of the invention is to provide an electronic device transfer apparatus which has an excellent capacity of transferring DUTs between trays, and an electronic device handling apparatus and an electronic device testing apparatus including the electronic device transfer apparatus.

[1] An electronic device transfer apparatus according to the invention is an electronic device transfer apparatus which transfers electronic devices to be tested between trays, the electronic device transfer apparatus comprising a conveying unit, wherein the conveying unit includes: a plurality of holding units which hold the electronic devices; an endless track which guides the holding units; and a moving unit which moves the holding units on the track, and the holding units are movable on the track over the entire circumference of the track.

[2] In the above invention, an interval between the plurality of holding units may be variable on the track.

[3] In the above invention, the moving unit may be independent of the holding units.

[4] In the above invention, the electronic device transfer apparatus may further comprises: a first transfer unit which transfers the electronic devices from a first tray to the holding units; and a second transfer unit which transfers the electronic devices from the holding units to a second tray.

[5] In the above invention, the track may include an inverted portion which is turned back in a vertical direction.

[6] In the above invention, the electronic device transfer apparatus may further comprise: a first transfer unit which transfers the electronic devices from a first tray to the holding unit with an attitude where terminals of the electronic devices are directed downward or upward; and a second transfer unit which transfers the electronic devices from the holding unit to a second tray with an attitude where the terminals are directed upward or downward.

[7] In the above invention, the track may include: a first horizontal portion along which the holding units are moved in a horizontal direction with an attitude where the terminals are directed downward; and a second horizontal portion along which the holding units are moved in the horizontal direction with an attitude where the terminals are directed upward, the inverted portion may include: a first inverted portion which connects one end of the first horizontal portion with one end of the second horizontal portion; and a second inverted portion which connects the other end of the second horizontal portion with the other end of the first horizontal portion, and the moving unit may include: a first moving unit which moves the holding unit from the other end of the first horizontal portion toward one end of the first horizontal portion; a second moving unit which moves the holding unit from one end of the second horizontal portion toward the other end of the second horizontal portion, and a third moving unit which moves the holding unit along the second inverted portion from the other end of the second horizontal portion toward the other end of the first horizontal portion.

[8] In the above invention, the holding unit may include a holding mechanism which holds the electronic devices even though the holding unit is inverted.

[9] In the above invention, the conveying unit may include a floating unit which floats the holding unit from the track with a compressed fluid interposed between the holding unit and the track.

[10] In the above invention, one of the trays may be a customer tray or a test tray, and the other thereof may be a test tray or a customer tray.

[11] An electronic device handling apparatus according to the invention is an electronic device handling apparatus which loads electronic devices to be tested onto a test tray, conveys the electronic devices, and presses the electronic devices against a contact portion of a test head in order to test the electronic devices, the electronic device handling apparatus comprising at least one of the above first electronic device transfer apparatus or the above second electronic device transfer apparatus, wherein the first electronic device transfer apparatus transfers untested electronic devices from the customer tray to the test tray, and a second electronic device transfer apparatus transfers tested electronic devices from the test tray to the customer tray.

[12] An electronic device testing apparatus according to the invention is an electronic device testing apparatus which tests electronic devices, the electronic device testing apparatus comprising: a test head; the above electronic device handling apparatus which presses the electronic devices against the contact portion of the test head; and a tester which is electrically connected to the test head.

According to the invention, it is possible to sequentially convey electronic devices by revolving a plurality of holding units on an endless track when the electronic devices are transferred between trays. Accordingly, it is possible to improve the capacity of transferring the electronic devices between the trays.

BRIEF DESCRIPTION OF THE DRAWINGS

FIGS. 9A to 9E are views illustrating a transfer operation for transferring a DUT from a customer tray to the shuttle in the embodiment of the invention, FIG. 9A is a view illustrating the outline of the transfer operation, and FIGS. 9B to 9E are views illustrating the respective steps of the transfer operation;

FIG. 11 is a graph illustrating a relation between the feed rate of a second feeder and the receiving rate of a third feeder;

FIGS. 12A to 12E are views illustrating a transfer operation for transferring a DUT from the shuttle to a test tray in the embodiment of the invention, FIG. 12A is a view illustrating the outline of the transfer operation, and FIGS. 12B to 12E are views illustrating the respective steps of the transfer operation;

FIG. 14A is a view illustrating the outline of the transfer operation, and FIGS. 14B to 14F are views illustrating the respective steps of the transfer operation; FIG. 15A is a view illustrating the outline of the transfer operation, and FIGS. 15B to 15E are views illustrating the respective steps of the transfer operation.

DETAILED DESCRIPTION OF THE PREFERRED EMBODIMENTS

An embodiment of the invention will be described below with reference to the drawings.

Figure 1:
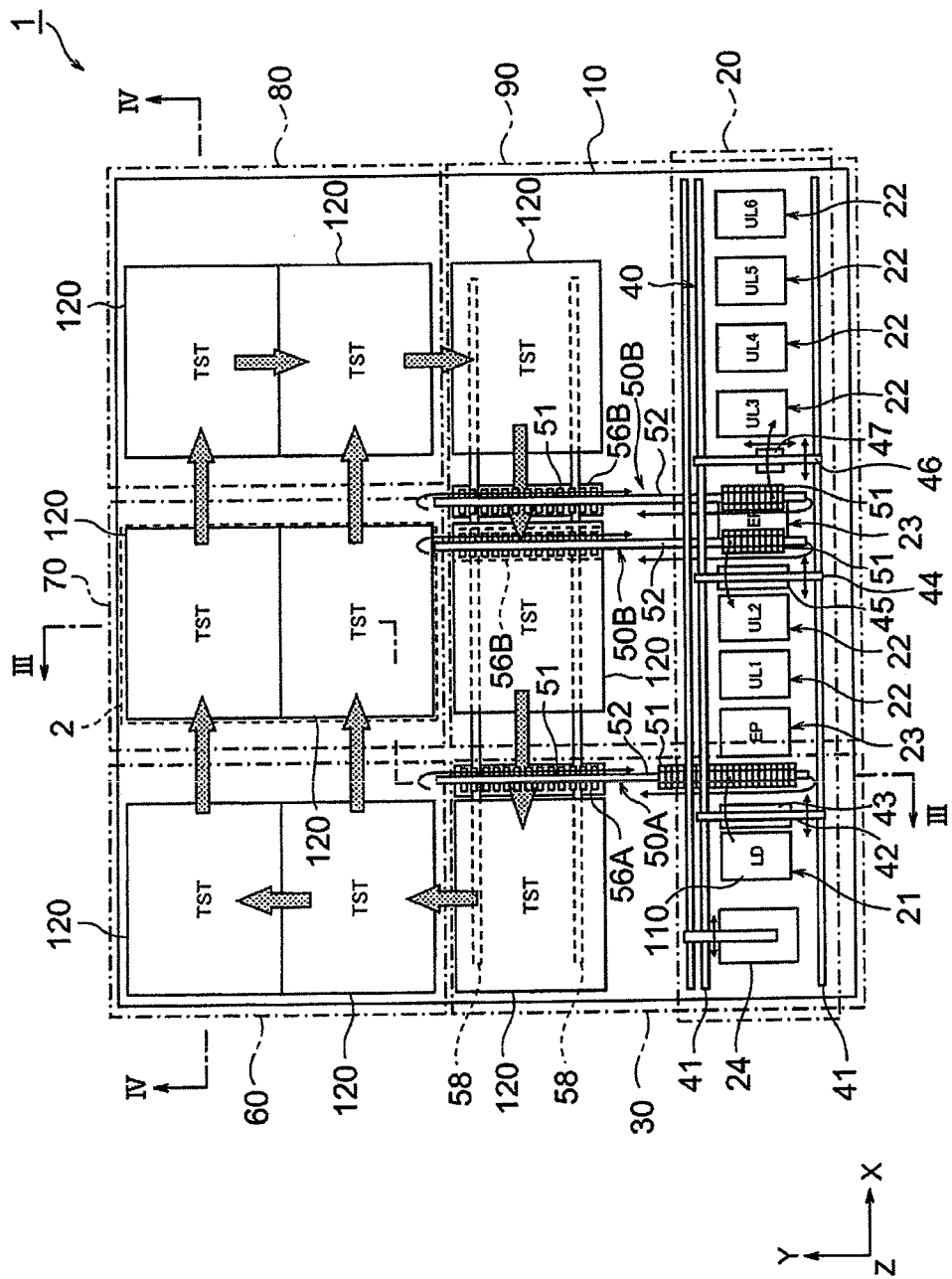
FIG. 1 is a plan view of an electronic device testing apparatus in an embodiment of the invention.
Figure 2:
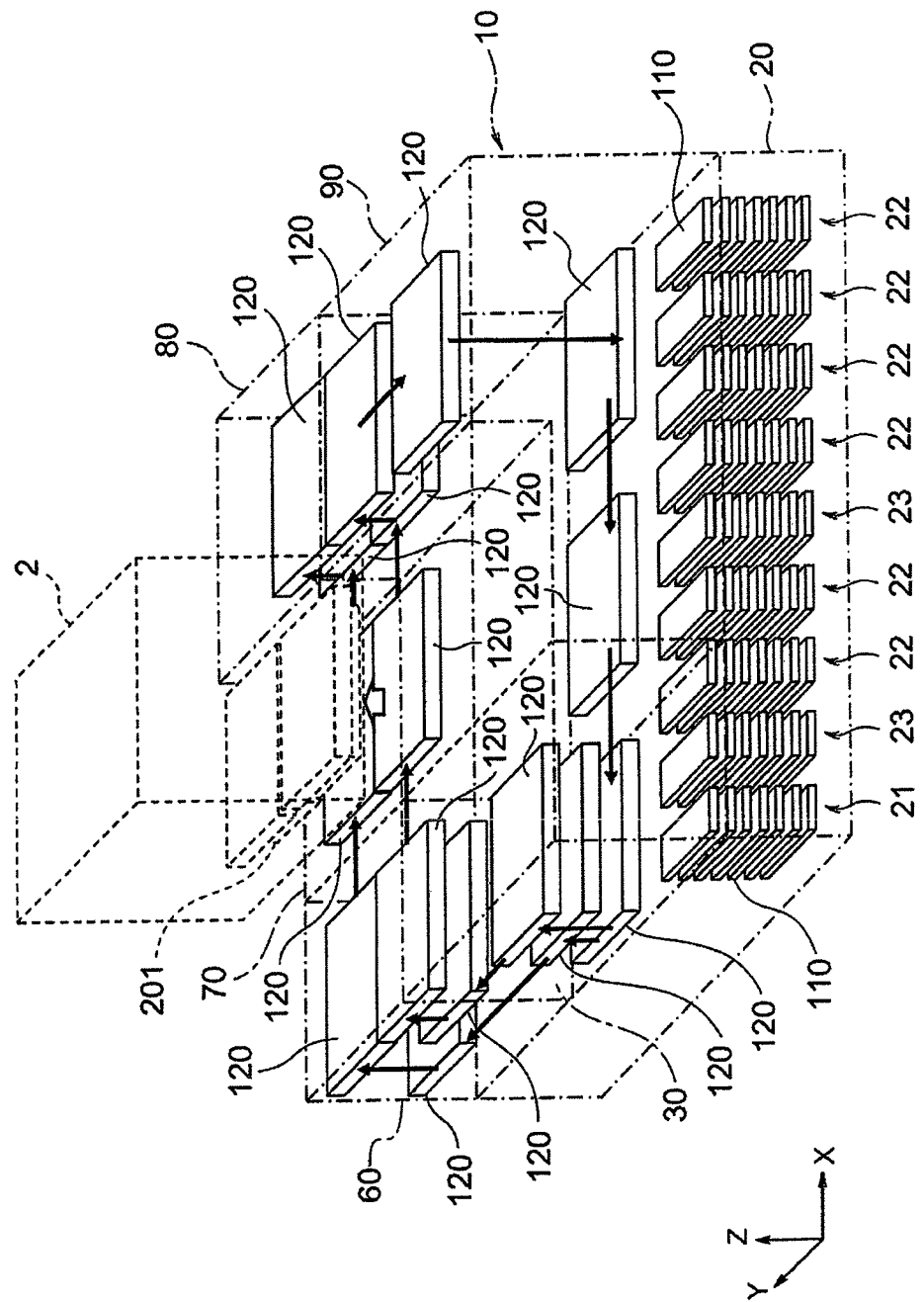
FIG. 2 is a perspective view of the electronic device testing apparatus in the embodiment of the invention.
Figure 3:
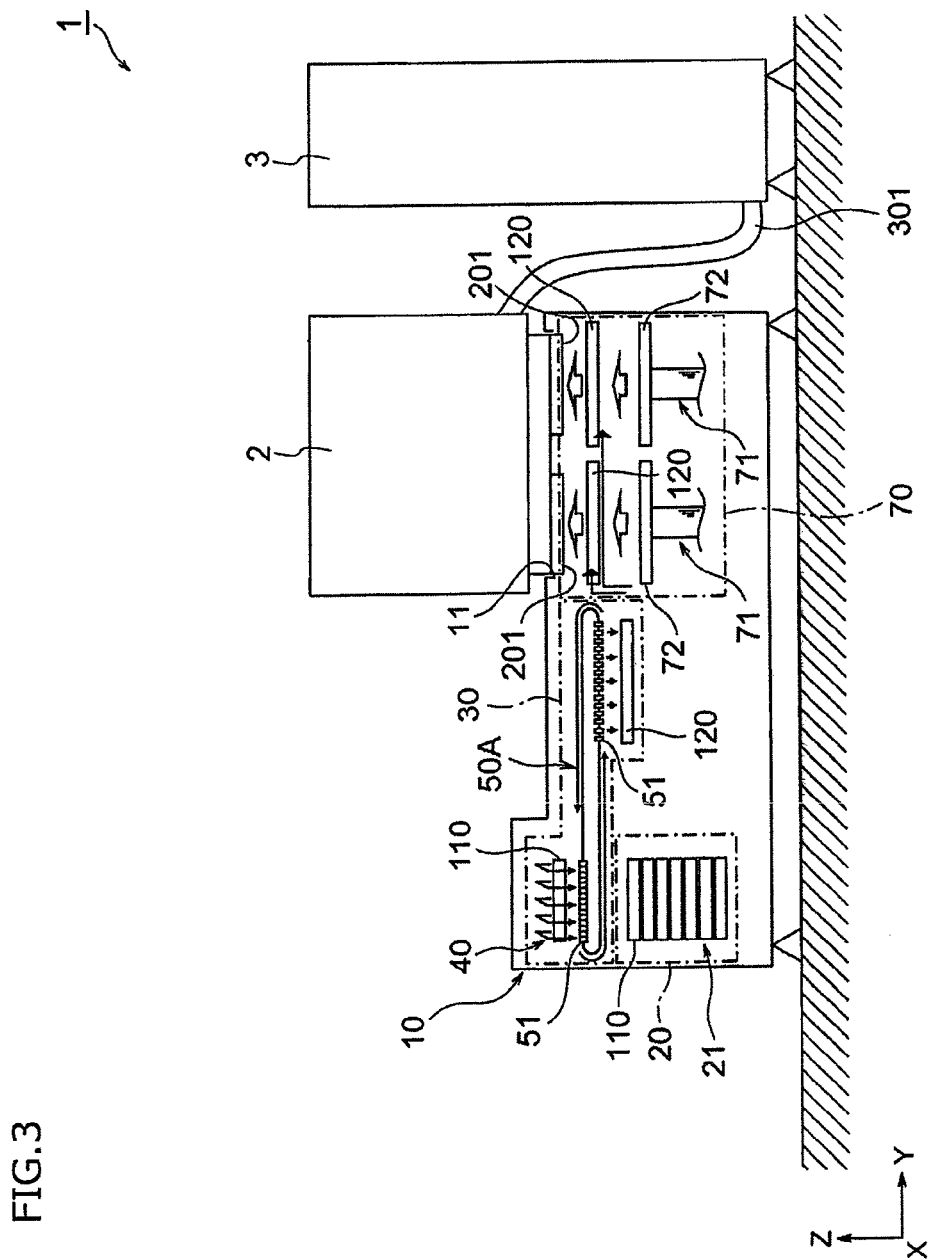
FIG. 3 is a cross-sectional view taken along line III-III of FIG. 1.
Figure 4:
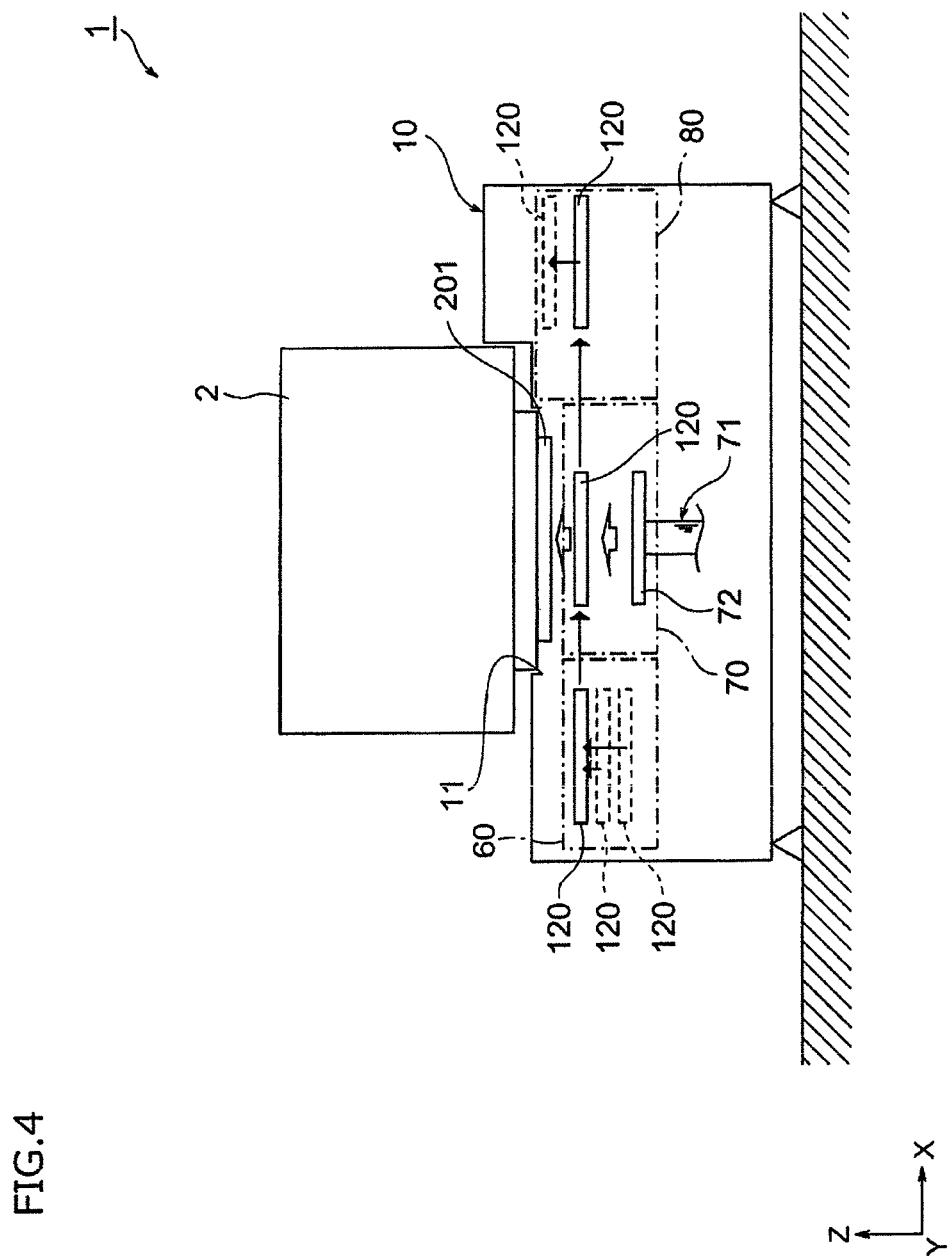
FIG. 4 is a cross-sectional view taken along line IV-IV of FIG. 1.

FIG. 1 and FIG. 2 are plan and perspective views in an electronic device testing apparatus of this embodiment, FIG. 3 is a cross-sectional view taken along line III-III of FIG. 1, and FIG. 4 is a cross-sectional view taken along line IV-IV of FIG. 1.

First, the structure of the electronic device testing apparatus 1 in this embodiment will be described.

The electronic device testing apparatus 1 of this embodiment is an apparatus that tests (examines) whether DUTs 100 appropriately operates in a state where high-temperature or low-temperature thermal stress is applied to the DUTs 100 (or a normal temperature state) and classifies the DUTs 100 on the basis of the test results. The electronic device testing apparatus 1 includes a test head 2, a tester 3, and a handler 10. The electronic device testing apparatus 1 loads DUTs 100 onto test trays 120, conveys the DUTs 100, and tests the DUTs 100. However, in the electronic device testing apparatus, the transfer of the DUTs 100 is performed between customer trays 110 and the test trays 120 before and after testing of the electronic devices. Meanwhile, the handler 10 of this embodiment is equivalent to an example of an electronic device handling apparatus of the present invention.

As illustrated in FIGS. 1 to 4, the handler 10 of this embodiment includes a storage section 20, a loader section 30, a heat applying section 60, a test section 70, a heat removing section 80, and an unloader section 90.

A plurality of customer trays 110 that receive untested or tested DUTs 100 are stored in the storage section 20. The customer tray 110 is a tray that is used to carry DUTs 100 into the handler 10 from other processes or to carry DUTs 100 to other processes from the handler 10. The customer tray 110 includes a plurality of receiving portions 111 in which DUTs 100 can be received (see FIGS. 9A and 15A). The receiving portions 111 are disposed in a matrix at a first pitch $P_1$.

The loader section 30 transfers the untested DUTs 100 to the test trays 120 from the customer trays 110 that are provided from the storage section 20, and conveys the test trays 120 to the heat applying section 60. The test tray 120 is a tray that circulates in the handler 10, and includes a plurality of (for example, 256) inserts 122 in which recesses 123 holding the DUTs 100 are formed (see FIGS. 12A, 13, and 14A). The inserts 122 are disposed in a matrix at a second pitch $P_2$ that is larger than the first pitch $P_1$ ($P_1 < P_2$).

The heat applying section 60 receives the test trays 120 from the loader section 30, and conveys the test trays 120 to the test section 70 after applying high-temperature (for example, room temperature to +160° C.) or low-temperature (for example, −60° C. to room temperature) thermal stress with respect to the untested DUTs 100 that are loaded onto the test trays 120.

In this embodiment, as illustrated in FIGS. 2 to 4, the test head 2 is mounted on the handler 10 in an inverted state, and sockets 201 of the test head 2 face the inside of the test section 70 of the handler 10 through an opening 11 that is formed at the upper portion of the handler 10.

The test section 70 makes terminals 101 of the DUTs 100 come into electrical contact with contact pins 202 of the sockets 201 by pressing the DUTs 100, which are loaded onto the test tray 120 fed from the heat applying section 60, against the sockets 201 of the test head 2.

Meanwhile, although not particularly illustrated, a plurality of (for example, 512) sockets 201 are disposed in a matrix on the test head 2. Accordingly, the array of the inserts 122 of the test tray 120 corresponds to the array of the sockets 201.

As illustrated in FIG. 3, the test head 2 is connected to the tester 3 through a cable 301. When the DUTs 100 are pressed against the sockets 201 by the handler 10, the tester 3 tests the DUTs 100 by inputting and outputting test signals to and from the DUTs 100 through the sockets 201, for example.

Meanwhile, when the kind of the DUTs 100 is changed, the sockets 201 disposed on the test head 2 are appropriately changed into sockets corresponding to the changed DUTs 100.

The heat removing section 80 receives the test trays 120 from the test section 70 and conveys the test trays 120 to the unloader section 90 after removing thermal stress from the DUTs 100 that have been completely tested.

The unloader section 90 classifies the DUTs 100 while transferring the tested DUTs 100 from the test trays 120 to the customer trays 110 which correspond to the test results. The customer trays 110 in which the tested DUTs 100 are received are stored in the storage section 20. Further, the test trays 120, from which all of the DUTs 100 have been transferred and which become empty, are conveyed to the loader section 30 by a tray conveying unit 58 (see FIG. 1).

The respective sections of the handler 10 will be described in detail below.

<Storage Section 20>

As illustrated in FIGS. 1 and 2, the storage section 20 includes an untested tray stocker 21, tested tray stockers 22, and empty tray stockers 23.

The untested tray stocker 21 stores a plurality of customer trays 110 that have received untested DUTs 100. Meanwhile, the tested tray stocker 22 stores a plurality of customer trays 110 that have received the DUTs 100 classified according to the test results. Further, the empty tray stocker 23 stores empty customer trays 110 that do not receive DUTs 100. Since six tested tray stockers 22 are provided in this embodiment, it is possible to classify DUTs 100 according to six kinds of test results to the maximum.

Although not particularly illustrated, each of these stockers 21 to 23 includes a frame-like tray support frame and an elevator that can be moved up and down in the tray support frame. A plurality of customer trays 110 are stacked in the tray support frame, and the stacked body of the customer trays is moved up and down by the elevator.

Meanwhile, since all of the stockers 21 to 23 have the same structure, the numbers of the untested tray stocker 21, the tested tray stockers 22, and the empty tray stockers 23 are not limited to the above-mentioned numbers and may be arbitrarily set. Furthermore, the total number of the tray stockers 21 to 23 is also not particularly limited to the above-mentioned number.

Moreover, the storage section 20 includes a tray transfer arm 24 that can transfer the customer tray 110.

For example, when all of the DUTs 100 are supplied to the loader section 30 from the uppermost customer tray 110 of the untested tray stocker 21 and the customer tray 110 becomes empty, the tray transfer arm 24 transfers the customer tray 110 from the untested tray stocker 21 to the empty tray stocker 23.

Further, for example, when the uppermost customer tray 110 of the tested tray stocker 22 is filled with the tested DUTs 100, the tray transfer arm 24 transfers a new empty customer tray 110 from the empty tray stocker 23 to the tested tray stocker 22.

Meanwhile, the structure of the storage section 20 is not particularly limited to the above-mentioned structure. For example, the tray transfer arm 24 may take the uppermost customer tray 110 out of the untested tray stocker 21 or the tested tray stocker 22 and may transfer the uppermost customer tray 110 onto a set plate and the set plate may be moved up toward a window portion formed at the base of the handler 10 so that the customer tray 110 is provided to the loader section 30 or the unloader section 90.

<Loader Section 30>

Figure 5:
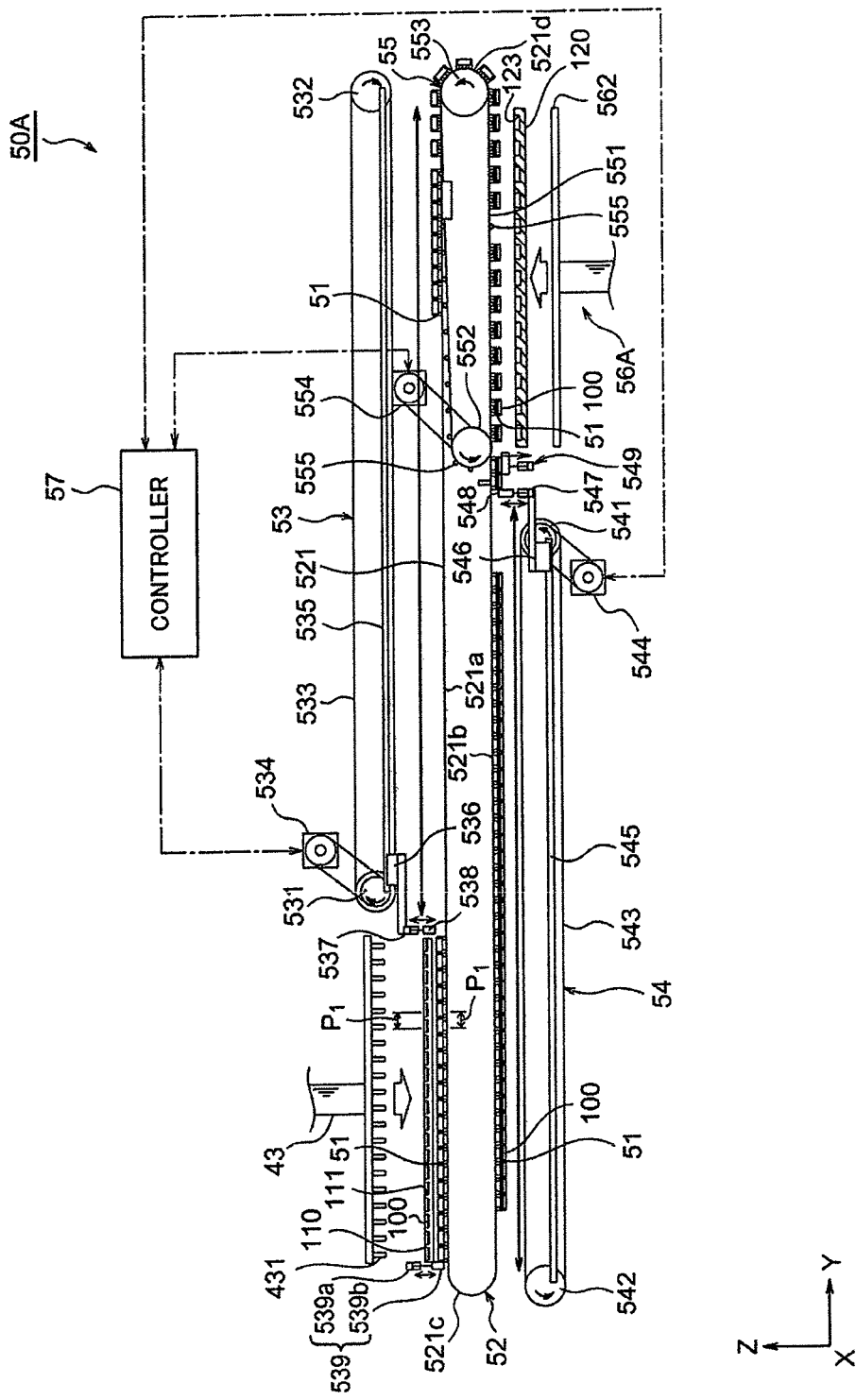
FIG. 5 is a side view of a device conveying unit of a loader section in the embodiment of the invention.
Figure 6:
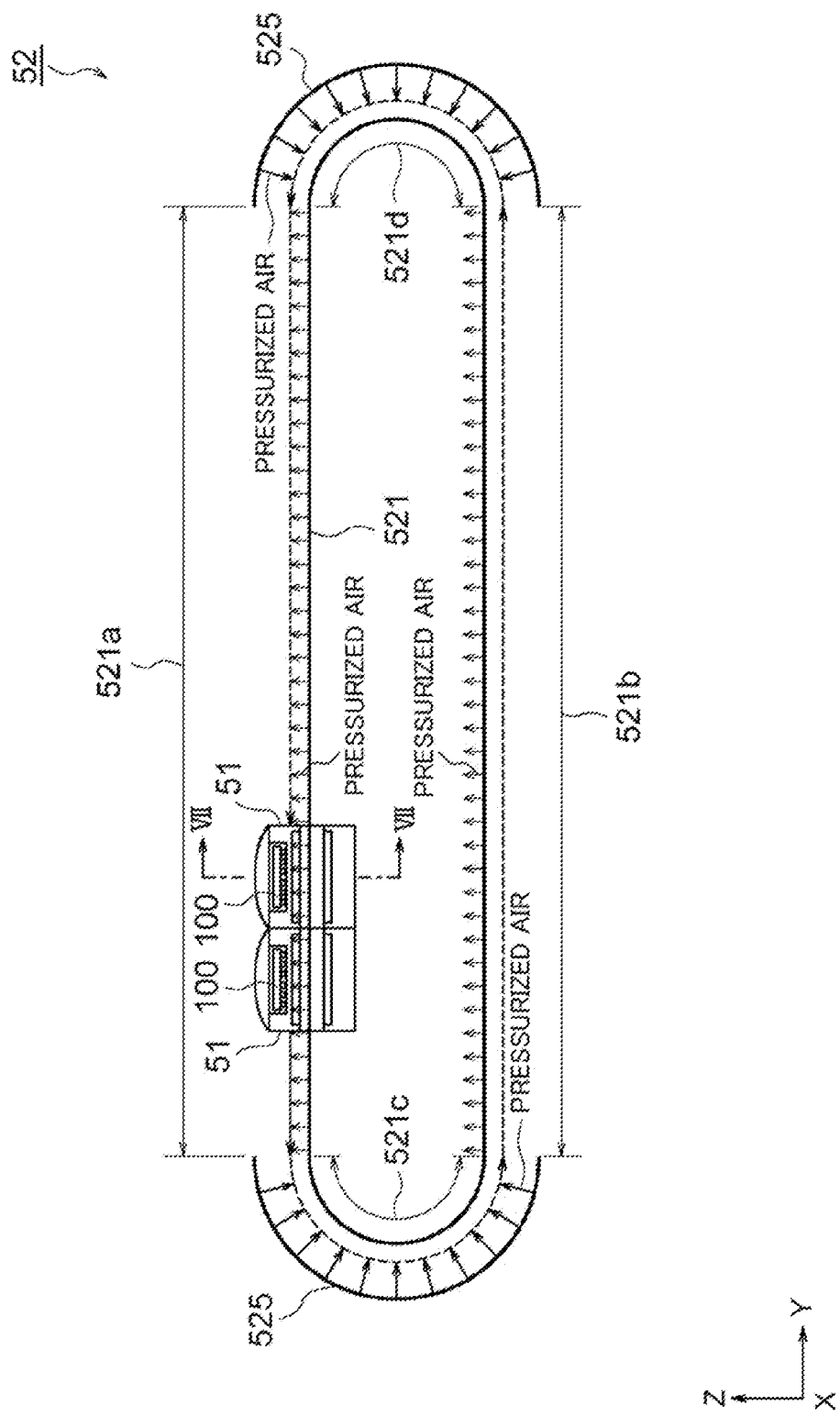
FIG. 6 is a side view illustrating shuttles and a guide rail of the device conveying unit illustrated in FIG. 5.
Figure 7:
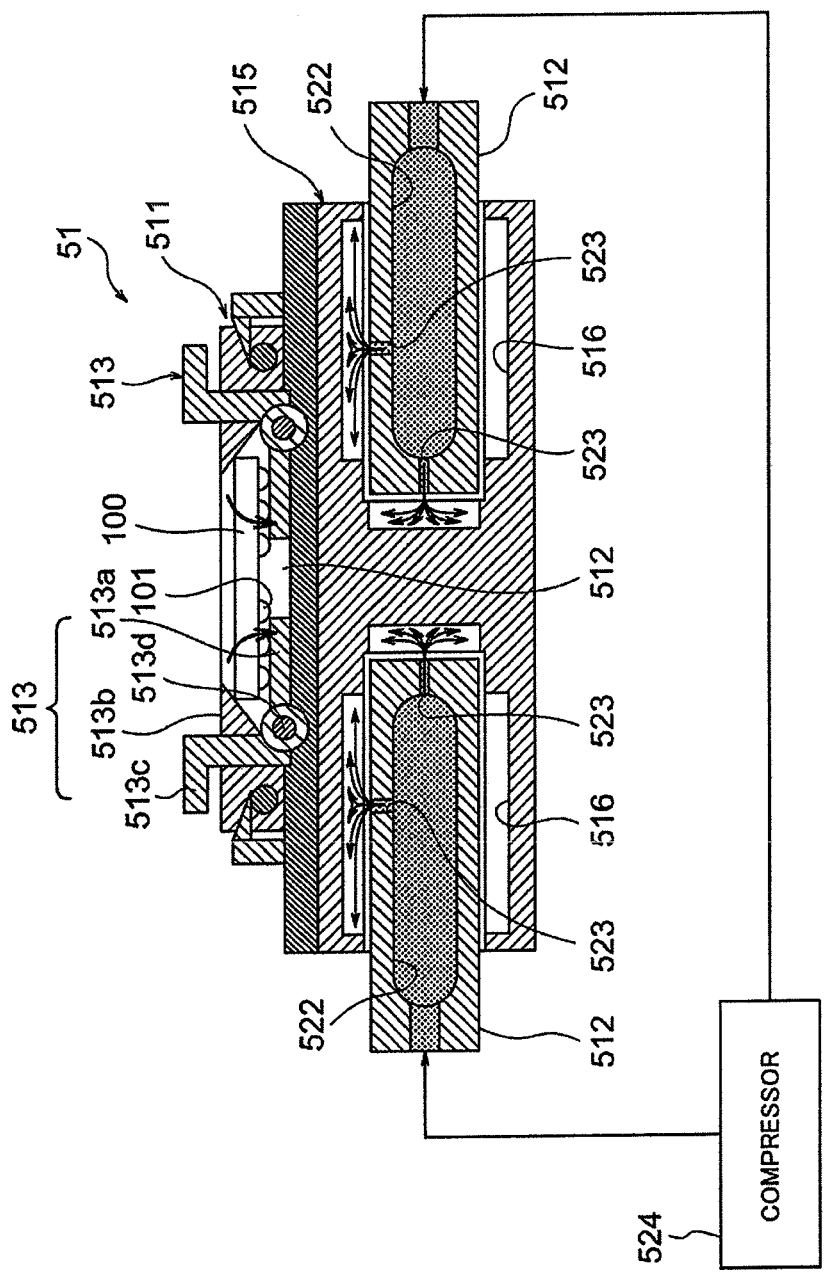
FIG. 7 is a cross-sectional view taken along line VII-VII of FIG. 6.
Figure 8:
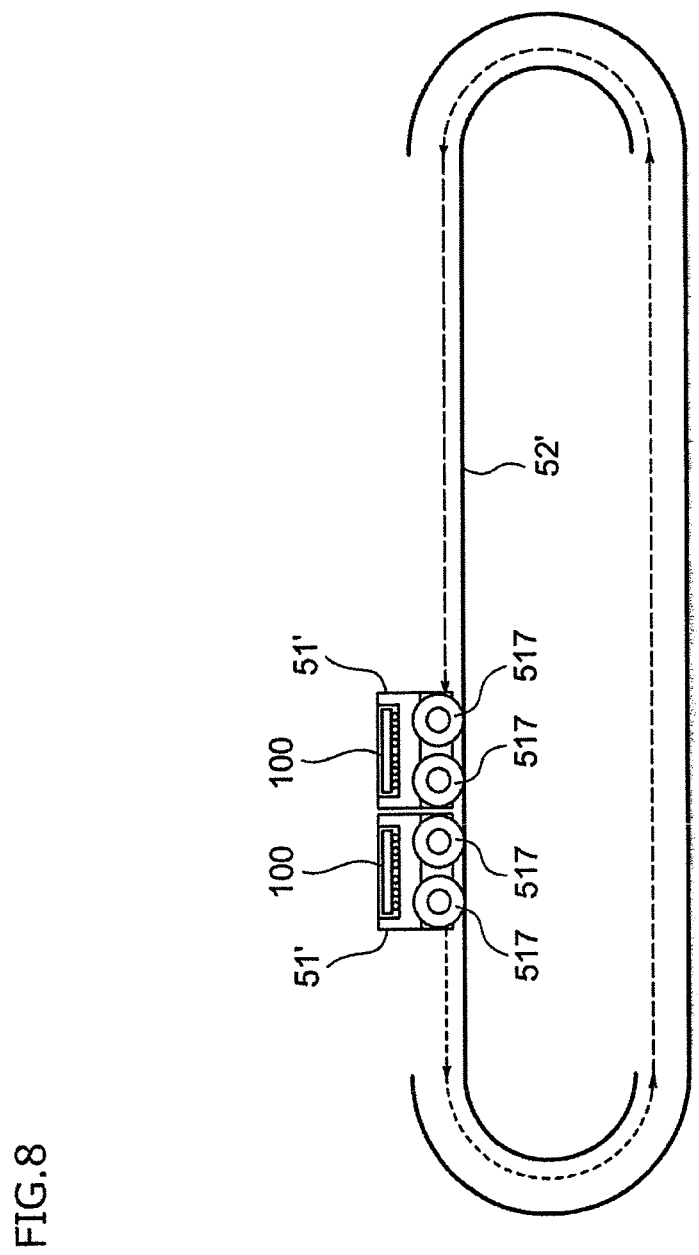
FIG. 8 is a side view illustrating a modification of the device conveying unit in the embodiment of the invention.
Figure 10:
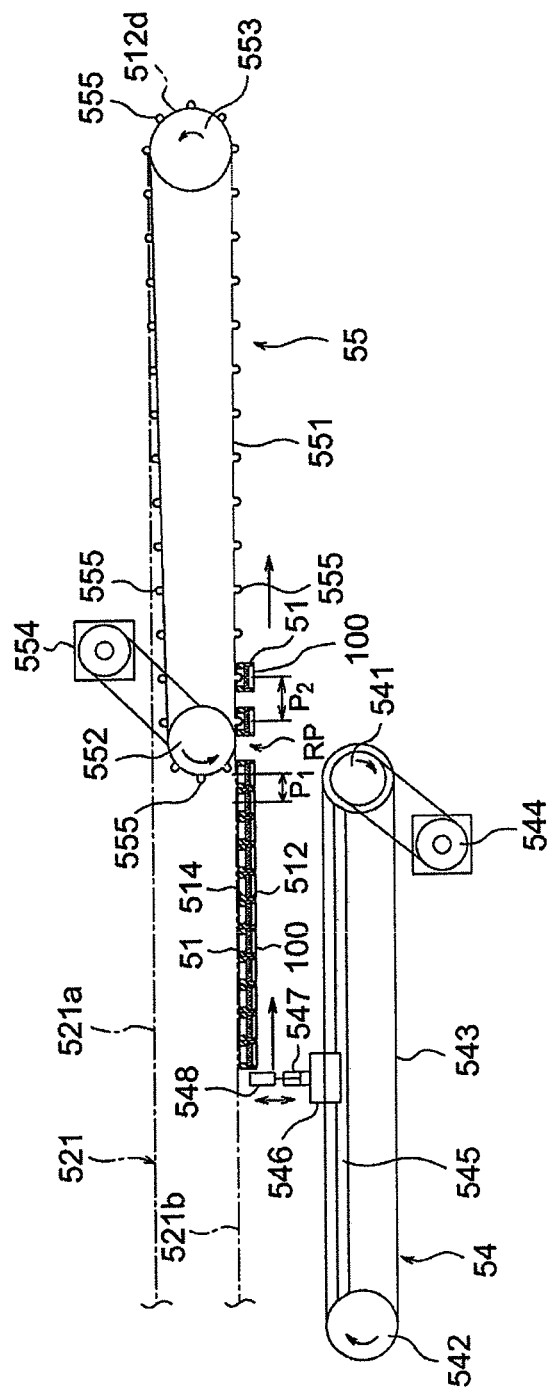
FIG. 10 is an enlarged view of a pitch changing mechanism of the device conveying unit illustrated in FIG. 5.

FIG. 5 is a side view of a device conveying unit of the loader section in this embodiment, FIG. 6 is a side view illustrating shuttles and a guide rail of the device conveying unit, FIG. 7 is a cross-sectional view taken along line VII-VII of FIG. 6, FIG. 8 is a side view illustrating a modification of the device conveying unit in this embodiment, FIGS. 9A to 9E are views illustrating a transfer operation for transferring a DUT from the customer tray to the shuttle in this embodiment, FIG. 10 is an enlarged view of a pitch changing mechanism of the device conveying unit illustrated in FIG. 5, FIG. 11 is a graph illustrating a relation between the feed rate of a second feeder and the receiving rate of a third feeder, and FIGS. 12A to 12E are views illustrating a transfer operation for transferring a DUT from the shuttle to a test tray in this embodiment.

As illustrated in FIG. 1, the loader section 30 includes a device transfer unit 40 and a device conveying unit 50A. In this embodiment, the DUT 100 is transferred to the test tray 120 by the device conveying unit 50A after the DUT 100 is transferred from the customer tray 110 to the device conveying unit 50A by the device transfer unit 40. The device conveying unit 50A and a first movable head 43 of the device transfer unit 40 of this embodiment are equivalent to an example of a first electronic device transfer apparatus of the present invention.

The device transfer unit 40 is a unit that transfers the DUT 100 from the customer tray 110 to the device conveying unit 50A. As illustrated in FIG. 1, the device transfer unit 40 includes a pair of X-direction rails 41 that are provided along the X direction, a first Y-direction rail 42 that slide along the X direction on the X-direction rails 41, and a first movable head 43 that is supported by the first Y-direction rail 42.

The first movable head 43 includes a plurality of (for example, 36) suction heads 431 (see FIGS. 5 and 9A) that can be moved up and down, respectively. Accordingly, the first movable head 43 can simultaneously hold a plurality of DUTs 100 by suction. Further, the suction heads 431 of the first movable head 43 are disposed in line at the same first pitch $P_1$ as the pitch of the receiving portions 111 of the above-mentioned customer tray 110. The first movable head 43 of the device transfer unit 40 of this embodiment is equivalent to an example of a first transfer unit of the present invention.

Furthermore, the first movable head 43 includes a latch opener 432 that opens latches 513 of shuttles 51 to be described below. The latch opener 432 includes protrusions 433 that protrude downward, and can be moved up and down independently of the suction heads 431.

Further, as illustrated in FIG. 1, the device transfer unit 40 includes two movable heads 45 and 47 in addition to the above-mentioned first movable head 43. However, these heads 45 and 47 are used to transfer DUTs 100 from device conveying units 50B to the customer trays 110 in the unloader section 90 to be described below.

Meanwhile, the second movable head 45 is supported by a second Y-direction rail 44 that can slide on the X-direction rails 41. Like the first movable head 43, the second movable head 45 includes a plurality of (for example, 36) suction heads 451 (see FIG. 15A) that can move up and down, and a latch opener 452 that can move up and down independently of the suction heads 451.

Meanwhile, the third movable head 47 is also supported by a third Y-direction rail 46 that can slide on the X-direction rails 41. However, the third movable head 47 can move along the Y direction on the third Y-direction rail 46 in order to deal with the test results of which the frequency of occurrence is low. Further, although not particularly illustrated, the third movable head 47 includes suction heads and a latch opener that are the same as those of the first and second movable heads 43 and 45. However, the number of the suction heads is smaller than the number of the suction heads of each of the first and second movable heads 43 and 45.

As illustrated in FIGS. 5 and 6, the device conveying unit 50A includes: a plurality of shuttles 51 that hold DUTs 100; a guide rail 52 that guides the shuttles 51; first to third feeders 53 to 55 that move the shuttles 51 on the guide rail 52; a latch opener 56A that transfers DUTs 100 from the shuttles 51 to the test tray 120; and a controller 57 that controls the first to third feeders 53 to 55.

The shuttles 51, the guide rail 52, and the first to third feeders 53 to 55 of this embodiment are equivalent to an example of a conveying unit of the present invention, the shuttle (a conveying carrier) 51 of this embodiment is equivalent to an example of a holding unit of the present invention, a first guide rail 521 of this embodiment is equivalent to an example of a track of the present invention, and the latch opener 56A of this embodiment is equivalent to an example of a second transfer unit of the present invention.

Further, the first feeder 53 of this embodiment is equivalent to an example of a first moving unit of the invention, the second feeder 54 of this embodiment is equivalent to an example of a second moving unit of the invention, and the third feeder 55 of this embodiment is equivalent to an example of a third moving unit of the invention.

As illustrated in FIG. 7, the shuttle 51 includes: a device holding portion 511 that holds a DUT 100; and a base portion 515 on which the device holding portion 511 is mounted. The device holding portion 511 includes: a device receiving hole 512 that receives the DUT 100; and a pair of latches 513 that restrain the DUT 100 in the device receiving hole 512. Further, the latches 513 of this embodiment is equivalent to an example of a holding mechanism of the present invention.

Each of the latches 513 includes: a first holding portion 513a that is positioned on the bottom of the device receiving hole 512; a second holding portion 513b that is positioned above the device receiving hole 512; a contact portion 513c that extends outward from the second holding portion 513b; and a rotating shaft 513d that connects the first holding portion 513a with the second holding portion 513b. The first holding portion 513a, the second holding portion 513b, and the contact portion 513c are integrally formed. The latch 513 is rotatably supported by the rotating shaft 513d, and is biased in the direction toward the inside of the device receiving hole 512 (in the direction of an arrow in FIG. 7) by an biasing member (not illustrated) such as a torsion spring.

When a DUT 100 is received in the device receiving hole 512, as illustrated in FIG. 7, the side of the DUT 100 on which terminals 101 are formed is held by the first holding portions 513a and the second holding portions 513b come into contact with the upper portion of the DUT 100. For this reason, when a DUT 100 is received in the device holding portion 511, the DUT 100 is fixed in the device receiving hole 512 by the latches 513. Accordingly, even though the shuttle 51 is inverted upside down, the DUT 100 does not fall from the shuttle.

Meanwhile, a pair of rail receiving grooves 516, which extend in the front-rear direction of the shuttle 51, are formed at both side portions of the base portion 515. The first guide rail 521 of the guide rail 52 is inserted into the rail receiving grooves 516 with some clearances, so that the shuttle 51 is guided along the first guide rail 521.

As illustrated in FIG. 6, the guide rail 52 includes the first guide rail 521 and second guide rails 525.

The first guide rail 521 includes: first and second horizontal portions 521a and 521b extending in the horizontal direction; and first and second inverted portions 521c and 521d connecting these horizontal portions 521a and 521b, and has an annular shape (an endless shape). The shuttle 51 can move (revolve) over the entire circumference of the first guide rail 521.

In this embodiment, the first and second inverted portions 521c and 521d are turned back in the vertical direction. Accordingly, the shuttle 51 moves on the first horizontal portion 521a with an attitude where the terminals 101 of the DUT 100 are directed downward, but moves on the second horizontal portion 521b with an attitude where the terminals 101 of the DUT 100 are directed upward.

Further, the shuttle 51 may be adapted to be moved over the entire circumference of the first guide rail 521 with an attitude where the terminals 101 of the DUT 100 are directed downward or upward while the first guide rail 521 is rotated with respect to the longitudinal direction at an angle of 90° from the state illustrated in FIG. 6. Furthermore, as long as the shape of the entire first guide rail 521 is an endless shape, the shape of the entire first guide rail 521 is not particularly limited to the shape that includes the above-mentioned two inverted portions.

As illustrated in FIG. 7, flow passages 522 and outlets 523 are formed in the horizontal portions 521a and 521b of the first guide rail 521. The flow passages 522 extend in the longitudinal direction of the first and second horizontal portions 521a and 521b and a compressor 524, which supplies a compressed fluid such as pressured air, is connected to the flow passages 522. The outlets 523 are opened to the upper and side surfaces of the first guide rail 521 from the flow passages 522.

When pressured air is discharged from the outlets 523, pressured air is interposed between the rail receiving grooves 516 of the shuttle 51 and the first guide rail 521. Accordingly, the shuttle 51 floats from the first guide rail 521. For this reason, since friction, which is generated when the shuttle 51 moves on the first guide rail 521, is significantly reduced, it is possible to reduce cost and to achieve maintenance free. The compressor 524 and the flow passages 522 and outlets 523 of the first guide rail 521 of this embodiment are equivalent to an example of a floating unit of the invention.

Meanwhile, the flow passages 522 or the outlets 523 are not formed in the inverted portions 521c and 521d of the first guide rail 521. However, as illustrated in FIG. 6, the second guide rails 525 are disposed outside the inverted portions 521c and 521d. Although not particularly illustrated, flow passages to which pressured air is supplied and outlets that are opened toward the inverted portions 521c and 521d of the first guide rail 521 from the flow passages are formed even in the second guide rails 525.

Pressured air is blown toward the upper portion of the shuttle 51 from the outlets of the second guide rails 525, so that the rattling of the shuttle 51 is suppressed when the shuttle 51 passes through the inverted portions 521c and 521d. Meanwhile, the second guide rails 525 are not illustrated in FIG. 5.

Instead of the above-mentioned static pressure system, bearings 517 are mounted on shuttles 51' as illustrated in FIG. 8 and the bearings 517 may be made to roll on a guide rail 52' so that the shuttles 51' move on the guide rail 52'.

Alternatively, although not particularly illustrated, shuttles may be moved by a belt conveyor instead of the guide rail.

Returning to FIG. 5, a plurality of (for example, 100 or more) shuttles 51 are mounted on the first guide rail 521 and an interval between these shuttles 51 is arbitrarily variable. Further, when the shuttles 51 come into contact with each other on the first guide rail 521, the pitch of the shuttles 51 is set to be substantially the same as the above-mentioned pitch $P_1$ of the receiving portions 111 of the customer tray 110. Further, when the shuttles 51 come into contact with each other on the first guide rail 521, the pitch of the shuttles 51 may be an integer multiple of the pitch $P_1$ of the receiving portions 111 of the customer tray 110.

As illustrated in FIG. 5, the first feeder 53 is provided along the first horizontal portion 521a of the first guide rail 521. The first feeder 53 includes pulleys 531 and 532, a belt 533, a motor 534, a guide rail 535, a slide block 536, an air cylinder 537, and a contact block 538.

The belt 533 is stretched on the pair of pulleys 531 and 532 in the shape of a loop, and the belt 533 is provided parallel to the first horizontal portion 521a of the first guide rail 521. Further, the motor 534 can rotationally drive one pulley 531.

Like the belt 533, the guide rail 535 is also provided parallel to the first horizontal portion 521a. The slide block 536 can slide on the guide rail 535 and is fixed to the belt 533.

The air cylinder 537, which can be extended and contracted in the up-down direction, is mounted on the end of the slide block 536, and the contact block 538, which comes into contact with the shuttle 51, is mounted on the end of the air cylinder 537.

The first feeder 53 rotates the pulley 531 clockwise in FIG. 5 by the motor 534 while the air cylinder 537 is extended. Accordingly, the first feeder 53 moves the slide block 536 to the left side in FIG. 5. As a result, the first feeder 53 moves the shuttle 51 on the first horizontal portion 521a. At this time, the first feeder 53 pushes the rearmost shuttle 51 by the contact block 538, so that the first feeder 53 moves the plurality of shuttles 51 in a lump while the shuttles 51 come into contact with each other. Meanwhile, when returning the contact block 538 to the origin, the first feeder 53 rotates the pulley 531 counterclockwise in FIG. 5 while the air cylinder 537 is contracted. Accordingly, the first feeder 53 moves the contact block 538 to the right side in FIG. 5. Further, a groove or a hole may be formed in each of the shuttles 51 and the contact block 538 may be inserted into the groove or the hole.

Furthermore, as illustrated in FIG. 5, a stopper 539 is provided near the end portion of the first horizontal portion 521a of the first guide rail 521. The stopper 539 includes: an air cylinder 539a that can be extended and contracted in the up-down direction; and a stopper block 539b that is mounted on the end of the air cylinder 539a. Accordingly, it is possible to stop the shuttle 51 at the end portion of the first horizontal portion 521a of the first guide rail 521 by extending the air cylinder 539a.

The customer trays 110 out of which the DUTs 100 are taken by the first movable head 43 of the device transfer unit 40 are positioned on the side of the end portion of the first horizontal portion 521a. In this embodiment, when the first feeder 53 loads the shuttles 51 onto the first guide rail 521 to the stopper 539 as illustrated in FIG. 5, the number of the shuttles 51 positioned between the stopper 539 and the contact block 538 is set to be equal to the number of the receiving portions 111 of the customer tray 110 in the Y direction.

Further, when the shuttles 51 are charged between the stopper 539 and the contact block 538, the first movable head 43 of the device transfer unit 40 simultaneously transfers a plurality of DUTs 100 from the customer tray 110 to the shuttles 51 as illustrated in FIG. 9A.

Specifically, first, the first movable head 43 approaches the customer tray 110 and holds DUTs 100 (FIG. 9B). Next, after the first movable head 43 is moved above the shuttles 51, the first movable head 43 opens the latches 513 by moving only the latch opener 432 down to press the contact portions 513c of the latches 513 of the shuttles 51 by the protrusions 433 (FIG. 9C). Next, after the first movable head 43 moves the suction heads 431 down to place the DUTs 100 on the first holding portions 513a of the latches 513 (FIG. 9D), the first movable head 43 moves the suction heads 431 and the latch opener 432 up (FIG. 9E).

When DUTs 100 are transferred to all the shuttles 51 charged between the stopper 539 and the contact block 538 in the above-mentioned manner, the first feeder 53 moves all the shuttles 51 in a lump by pushing the rearmost shuttle 51 through the next empty shuttle 51. The shuttles 51, which are pushed to the first inverted portion 521c of the first guide rail 521 by the first feeder 53, are moved from the first inverted portion 521c to the second horizontal portion 521b by their own weight.

As illustrated in FIGS. 5 and 10, the second feeder 54 is provided along the second horizontal portion 521b of the first guide rail 521. Like the above-mentioned first feeder 53, the second feeder 54 also includes a pair of pulleys 541 and 542, a belt 543, a motor 544, a guide rail 545, a slide block 546, an air cylinder 547, and a contact block 548.

Like the above-mentioned first feeder 53, the second feeder 54 is also adapted so as to be capable of moving the shuttle 51 to the right side in FIGS. 5 and 10 on the second horizontal portion 521b by moving the slide block 546 while the air cylinder 547 is extended. Accordingly, the second feeder 54 pushes the rearmost shuttle 51 by the contact block 548, so that the second feeder 54 moves a predetermined number (for example, the same number as the number of the inserts 122 of the test tray 120 in the Y direction) of shuttles 51 toward the third feeder 55 in a lump while the shuttles 51 come into contact with each other. Further, a stopper 549, which stops the shuttle 51 on the second horizontal portion 521b, is also provided near the end of the second feeder 54.

As illustrated in FIGS. 5 and 10, the third feeder 55 is disposed so as to overlap the horizontal portions 521a and 521b of the first guide rail 521 and the second inverted portion 521d, and includes: a belt 551 that is provided along the first guide rail 521; a pair of pulleys 552 and 553 on which the belt 551 is stretched in the shape of a loop; and a motor 554 that rotationally drives one pulley 552.

A plurality of pins 555, which can be engaged with engagement grooves 514 (see FIG. 10) formed at the bottoms of the shuttles 51, are provided on the outer peripheral surface of the belt 551. The pins 555 are disposed on the belt 551 at the same second pitch $P_2$ as the above-mentioned pitch of the inserts 122 of the test tray 120.

When the shuttles 51 are supplied to the third feeder 55 by the second feeder 54, the pins 555 of the belt 551 are engaged with the engaging grooves 514 of the shuttles 51 and the third feeder 55 moves the shuttles 51 along the first guide rail 521 in the order of the second horizontal portion 521b, the second inverted portion 521d, and the first horizontal portion 521a.

Meanwhile, the pulley 552 illustrated on the left side in FIG. 10 has a radius smaller than the radius of the pulley 553 illustrated on the right side in FIG. 10. Accordingly, the belt 551 overlaps the second horizontal portion 521b and the second inverted portion 521d of the first guide rail 521, but is adapted so as to be gradually separated from the first horizontal portion 521a. For this reason, when the shuttles 51 are carried to the first horizontal portion 521a by the third feeder 55, the shuttles 51 are disengaged from the pins 555 on the first horizontal portion 521a.

In this embodiment, the first to third feeders 53 to 55 are controlled by the controller 57 as illustrated in FIG. 5. The controller 57 controls the second and third feeders 54 and 55 so that the feed rate of the second feeder 54 feeding the shuttles 51 is different from the receiving rate of the third feeder 55 receiving the shuttles 51.

Specifically, as illustrated in FIG. 11, the controller 57 controls the second and third feeders 54 and 55 so that the moving speed (receiving rate, illustrated in FIG. 11 by a solid line) of the pins 555 moved by the third feeder 55 is higher than the moving speed (feed rate, illustrated in FIG. 11 by a broken line) of the contact block 548 moved by the second feeder 54. For this reason, when the third feeder 55 receives the shuttles 51 from the second feeder 54, the pitch of the shuttles 51 positioned on the second horizontal portion 521b along the Y direction is changed from $P_1$ into $P_2$.

Meanwhile, in this embodiment, the tray conveying unit 58 moves the test tray 120 along the X direction by one pitch of the inserts 122 whenever DUTs 100 are loaded onto all the inserts 122 of the test tray 120, which are disposed in line along the Y direction, by the device conveying unit 50A. Accordingly, the pitch of the DUTs 100 along the X direction is changed from the pitch of the receiving portions 111 of the customer tray 110 into the pitch of the inserts 122 of the test tray 120.

Meanwhile, a plurality of (for example, 512) sockets 201 are mounted on the test head 2 as described above, but there is also a case where some sockets, which cannot be used due to a breakdown or the like, are present among these sockets. In this case, when DUTs 100 are transferred from the customer tray 110 to the test tray 120, DUTs 100 do not have been loaded onto the inserts 122 of the test tray 120 corresponding to broken sockets 201 in the past (a so-called DUT-off function).

In this embodiment, the feed rate of the second feeder 55 (illustrated by a two-dot chain line in FIG. 11) intermittently becomes zero (that is, the second feeder 54 is intermittently stopped) while the receiving rate of the third feeder 54 (illustrated by a dashed-dotted line in FIG. 11) is maintained at a predetermined value or more as illustrated by a dashed-dotted line and a two-dot chain line in FIG. 11. Accordingly, the DUT-off function is achieved.

Specifically, when the pin 555 corresponding to the insert 122 onto which the DUT 100 is not loaded approaches a receiving position RP (see FIG. 10) from the second feeder 54, a shuttle 51 is not supplied to the pin 555 by temporarily stopping the motor 544 of the second feeder 54 (that is, making the feed rate of the shuttles 51 fed by the second feeder 54 temporarily become zero) while the motor 554 of the third feeder 55 is driven. Further, after the pin 555 passes through the receiving position RP, the second feeder 54 supplies a shuttle 51 to the next pin 555 by resuming the drive of the motor 544. Meanwhile, when a large difference in speed is present between the feed rate of the third feeder 55 and the receiving rate of the second feeder 54, the feed rate of the second feeder 54 does not need to completely become zero.

As illustrated in FIG. 5, the test tray 120, which receives the DUTs 100 from the shuttles 51, is disposed below the third feeder 55. When moving a predetermined number (for example, the same number as the number of the inserts 122 of the test tray 120 along the Y direction) of shuttles 51 above the inserts 122 of the test tray 120, the third feeder 55 stops the motor 554 once.

The latch opener 56A is disposed below the test tray 120. As illustrated in FIG. 12A, the latch opener 56A includes: protrusions 561 that can be inserted into through holes 124 formed in the inserts 122 of the test tray 120; and a support plate 562 that supports the protrusions 561. The support plate 562 can be moved up and down by an air cylinder or the like. The latch opener 56A transfers DUTs 100 from the shuttles 51 to the test tray 120.

Specifically, the latch opener 56A approaches the test tray 120 from below (FIG. 12B), and inserts the protrusions 561 into the through holes 124 of the inserts 122 (FIG. 12C). Next, the latch opener 56A opens the latches 513 by further moving the protrusions 561 up to press the contact portions 513c of the latches 513 of the shuttles 51 (FIG. 12D). Accordingly, when the DUTs 100 held by the second holding portions 513b of the latches 513 are transferred from the device receiving holes 512 of the shuttles 51 into the recesses 123 of the inserts 122, the latch opener 56A is separated from the test tray 120 (FIG. 12E).

The shuttles 51, from which the DUTs 100 have been transferred and which become empty, are conveyed to the first horizontal portion 521a of the first guide rail 521 by the third feeder 55. Meanwhile, the test tray 120 to which the DUTs 100 are transferred by the device conveying unit 50A is conveyed to the heat applying section 60.

<Heat Applying Section 60>

As illustrated in FIGS. 2 and 4, the heat applying section 60 applies predetermined thermal stress to the DUTs 100 loaded onto the test tray 120 while moving the test tray 120, which is supplied from the loader section 30, up by a vertical conveying unit (not shown).

Since the test tray 120 is conveyed upward in the heat applying section 60 as described above in this embodiment, it is possible to make the height of the heat applying section 60 be the same as the height of the test section 70. Accordingly, since the heat applying section 60 hardly interferes with the test head 2 disposed on the handler 10, it is possible to increase a degree of freedom in the size of the test head 2.

Further, generally, sensors, which detect the abnormalities of the test tray, are installed immediately before the test section in the heat applying section. In contrast to this, since the test tray 120 is conveyed upward in the heat applying section 60 in this embodiment, it is possible to approach the test tray 120, immediately before the test tray 120 is supplied to the test section 70, from above, so that it is possible to easily eliminate the jamming of the test tray 120. Accordingly, the heat applying section is excellent even in maintenance.

In the heat applying section 60, a block for temperature control comes into contact with each of the DUTs 100 loaded onto the test tray 120 to heat or cool the DUT 100, so that the temperature of the DUT 100 is controlled.

Flow passages to which a warming medium and a refrigerant are supplied are formed in the block. Accordingly, the temperature of the block is controlled by the adjustment of the flow rate of each of the warming medium and the refrigerant. Specifically, a temperature controller disclosed in, for example, International Publication No. WO2009/017495, International Publication No. WO2010/137137, or the like may be employed.

Meanwhile, a chamber system in the related art may be used instead of the temperature controller using the above-mentioned fluids. In this case, the entire heat applying section 60 is received in a thermostatic chamber and the atmosphere in the thermostatic chamber is set to high temperature by using a heater or the like, so that the DUTs 100 are heated. Meanwhile, when the DUTs 100 are to be cooled, the atmosphere in the thermostatic chamber is set to low temperature by using liquid nitrogen or the like.

When predetermined thermal stress is applied to the DUTs 100 in the heat applying section 60, the test tray 120 onto which the DUTs 100 are loaded is conveyed to the test section 70. Meanwhile, while being arranged side by side as illustrated in FIGS. 1 and 2 in this embodiment, two test trays 120 are conveyed from the heat applying section 60 to the test section 70.

<Test Section 70>

Figure 13:
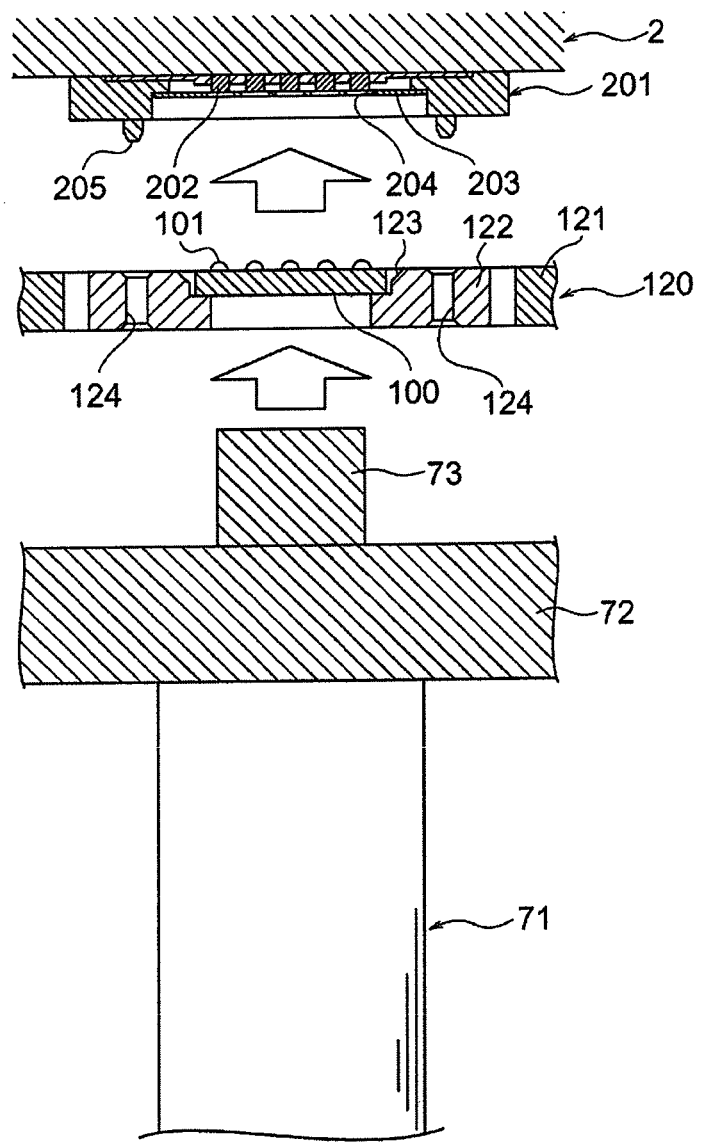
FIG. 13 is a cross-sectional view illustrating the structure of a test section of an electronic device handling apparatus and an upper portion of a test head in the embodiment of the invention.

FIG. 13 is a cross-sectional view illustrating the structure of the test section of the handler and an upper portion of the test head in this embodiment.

As described above, in this embodiment, the sockets 201 of the test head 2 face the inside of the test section 70 of the handler 10 through the opening 11 from above as illustrated in FIGS. 3 and 4. A Z-drive unit 71 is disposed in the test section 70 so as to face the sockets 201 of the test head 2.

As illustrated in FIG. 13, a plurality of pushers 73 are mounted on a top plate 72 of the Z-drive unit 71 and the pushers 73 are arrayed in a matrix on the top plate 72 so as to correspond to the sockets 201 of the test head 2. When the Z-drive unit 71 moves the top plate 72 up, the pushers 73 press the DUTs 100 against the sockets 201 and make the terminals 101 of the DUTs 100 come into electrical contact with the contact pins 202 of the sockets 201. Meanwhile, since the pusher 73 is also provided with the temperature controller using the above-mentioned fluid, the pusher 73 can control the temperature of the DUTs 100 during the test.

In this embodiment, the sockets 201 of the test head 2 are provided with alignment plates 203 as illustrated in FIG. 13. A plurality of through holes 204 are formed in the alignment plates 203 so as to correspond to the contact pins 202 of the sockets 201. When the DUTs 100 approach the sockets 201 by the Z-drive unit 71, the terminals 101 of the DUTs 100 are inserted into the through holes 204 of the alignment plates 203. Then, the terminals 101 are guided by the through holes 204, so that the DUTs 100 are positioned relative to the sockets 201.

Meanwhile, the inserts 122 are held by a frame 121 of the test tray 120 while floating in the XY plane direction. Accordingly, guide pins 205 erected on the peripheral portion of the sockets 201 are inserted into the through holes 124 of the inserts 122, so that the inserts 122 are positioned relative to the sockets 201.

Since DUTs are positioned relative to the sockets with inserts interposed therebetween in the handler in the related art, a loader section is provided with a preciser. When DUTs are transferred from the customer tray to the test tray, the DUTs are placed on the preciser once, so that the DUTs are accurately positioned relative to the inserts.

In contrast to this, the DUTs 100 are directly positioned relative to the sockets 201 by the alignment plates 203 mounted on the sockets 201 as described above in this embodiment. Accordingly, the loader section 30 does not require a preciser, so that it is possible to effectively use a space in the handler 10.

Further, when DUTs are positioned relative to the sockets with the inserts interposed therebetween as in the related art, all inserts of all test trays, which circulate in the handler, need to be provided with positioning mechanisms (for example, guide cores or the like). However, since the sockets 201 of the test head 2 only have to be provided with the alignment plates 203 in this embodiment, it is possible to significantly reduce costs.

In this embodiment, in the test section 70, a plurality of (for example, 512) DUTs 100 loaded onto two test trays 120 are simultaneously tested, and the two test trays 120 onto which the DUTs 100 are loaded are conveyed to the heat removing section 80 when the test is completed.

<Heat Removing Section 80>

As illustrated in FIGS. 2 and 4, the heat removing section 80 removes thermal stress, which has been applied to the DUTs by the heat applying section 60, from the DUTs 100 loaded onto the test tray 120 which are carried from the test section 70 while moving the test trays 120 up by the vertical conveying unit (not shown).

Meanwhile, like the above-mentioned heat applying section 60, the height of the heat removing section 80 may be the same as the height of the test section 70 by moving the test trays 120, which are carried from the test section 70, down by the vertical conveying unit in the heat removing section 80. However, the heat removing section 80 moves the test trays 120 up, so that the test trays 120 can be conveyed from the test section 7 to the heat removing section 800 by a belt conveying unit. Accordingly, it is possible to reduce the costs of the handler 10.

When the heat applying section 60 has applied high-temperature thermal stress to the DUTs 100, the heat removing section 80 blows air to the DUTs 100 by using a fan or the like to cool the DUTs 100 so that the DUTs 100 return to a room temperature. In contrast to this, if the heat applying section 60 has applied low-temperature thermal stress to the DUTs 100, the heat removing section 80 blows hot air to the DUTs 100 or heats the DUTs 100 by a heater so that the DUTs 100 return to a temperature where dew condensation does not occur.

When thermal stress is removed from the DUTs 100 in the heat removing section 80, the test trays 120 onto which the DUTs 100 are loaded are conveyed to the unloader section 90 one by one.

<Unloader Section 90>

FIGS. 14A to 14F are illustrating a transfer operation for transferring a DUT from the test tray to the shuttle in this embodiment, and FIGS. 15A to 15E are illustrating a transfer operation for transferring a DUT from the shuttle to the customer tray in this embodiment.

Since the unloader section 90 includes two device conveying units 50B and SOB as illustrated in FIG. 1, the unloader section 90 can transfer DUTs 100 from one or two test trays 120 to the customer trays 110.

The device conveying unit SOB of the unloader section 90 is the same as the device conveying unit 50A of the above-mentioned loader section 30 except for the structure of a latch opener 56B.

Figure 14A:
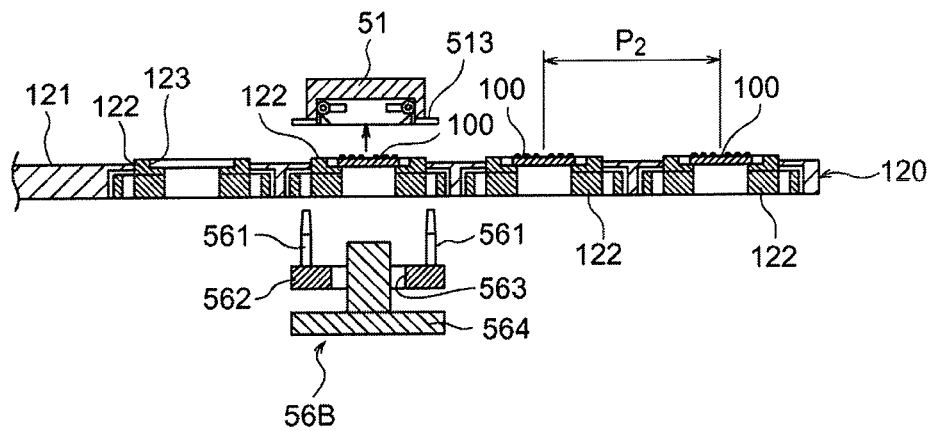
FIGS. 14A to 14F are views illustrating a transfer operation for transferring a DUT from the test tray to the shuttle in the embodiment of the invention.
Figure 14B:
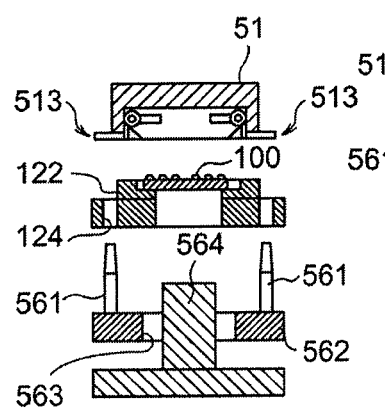
Figure 14C:
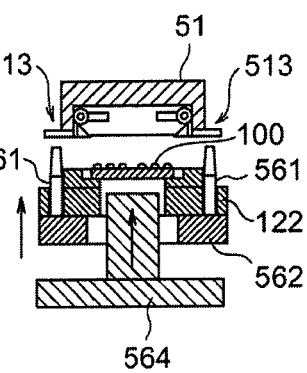

As illustrated in FIG. 14A, the latch opener 56B of the unloader section 90 includes a push-up unit 564 that pushes the DUTs 100 up and a through hole 563 through which the push-up unit 564 can pass is formed in the support plate 562. The push-up unit 564 can be moved up and down by an air cylinder or the like independently of the support plate 562.

The unloader section 90 transfers the DUTs 100 from the test tray 120 to the shuttle 51 of the device conveying unit 50B by using the latch opener 56B. The latch opener 56B of this embodiment is equivalent to an example of first transfer unit of the present invention.

Figure 14D:
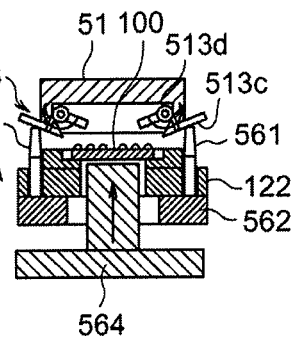
Figure 14E:
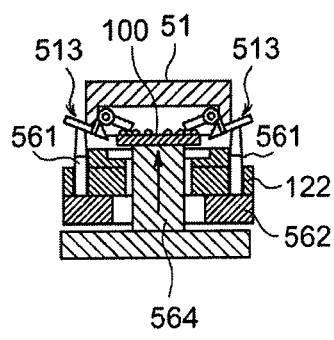
Figure 14F:
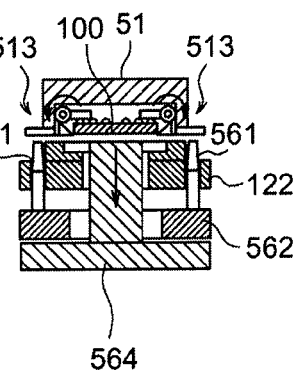

Specifically, the latch opener 56B opens the latches 513 by approaching the test tray 120 from below (FIG. 14B), moving the support plate 562 and the push-up unit 564 up, inserting the protrusions 561 into the through holes 124 of the inserts 122 (FIG. 14C), and pressing the contact portions 513c of the shuttles 51 by the protrusions 561 (FIG. 14D). Next, only the push-up unit 564 moves up and positions the DUTs 100 between the opened latches 513 (FIG. 14E). Next, the push-up unit 564, moves down and separates from the DUT 100 (FIG. 14F) after only the support plate 562 moves down, closes the latches 513, and the DUTs 100 are held on the second holding portions 513b of the latches 513.

Meanwhile, after the DUTs 100 are transferred to the shuttles 51 from all the inserts 122 of the test tray 120 that are disposed in line along the Y direction, the tray conveying unit 58 moves the test tray 120 along the X direction by one pitch of the inserts 122. Further, after the DUTs 100 are carried out of all the inserts 122 disposed on the test tray 120, the empty test tray 120 is returned to the loader section 30 by the tray conveying unit 58. Meanwhile, for example, a belt conveyor, a rotary roller, or the like may be exemplified as a specific example of the tray conveying unit 58.

After the DUTs 100 are transferred to the shuttles 51 by the latch opener 56B, the device conveying unit 50B moves the shuttles 51 to the vicinity of the customer tray 110 by the third feeder 55 and the first feeder 53. At this time, as illustrated in FIGS. 5 and 10, when the shuttles 51 are conveyed to the first horizontal portion 521a of the first guide rail 521 by the third feeder 55, the shuttles 51 are separated from the pins 555 of the third feeder 55 and the pitch of the shuttles 51 becomes free.

Meanwhile, since the DUTs 100 corresponding to the same result of the test are irregularly disposed in the test tray 120, a pick-and-place unit in the related art individually lifts up the DUTs 100, which correspond to the same result of the test, from the test tray 120.

In contrast to this, the device conveying unit 50B of the unloader section 90 makes the feed rate of the second feeder 54 intermittently become zero while maintaining the receiving rate of the third feeder 55 at a predetermined value or more in the same manner as the above-mentioned DUT-off function in this embodiment. Accordingly, the device conveying unit 50B conveys the shuttle 51 from the second feeder 54 to the third feeder 55 so that the shuttles 51 are supplied to only the DUTs 100 that correspond to the same result of the test on the test tray 120. Therefore, since the DUTs 100 are received in all the shuttles 51 that are conveyed to the first horizontal portion 521a by the third feeder 55, it is possible to improve the efficiency of an operation for classifying the DUTs in the unloader section 90.

Figure 15A:
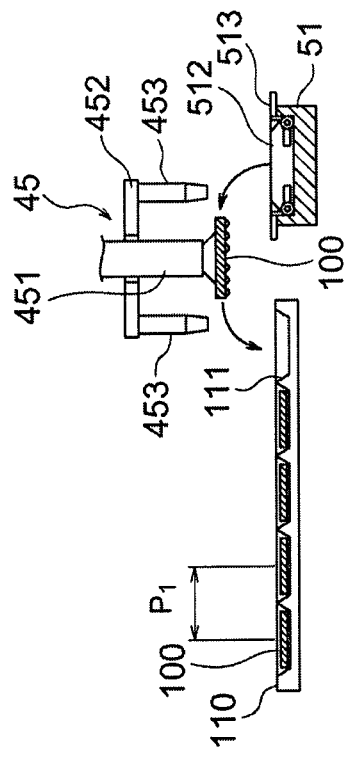
FIGS. 15A to 15E are views illustrating a transfer operation from the shuttle to the customer tray in the embodiment of the invention.

Further, when the first feeder 53 loads the shuttles 51 onto the first horizontal portion 521a up to the stopper 539, as illustrated in FIG. 15A, the DUTs 100 are transferred from the shuttles 51 of the device conveying unit 50B to the customer tray 110 by the above-mentioned second and third movable heads 45 and 47 of the device conveying unit 40. The second and third movable heads 45 and 47 of this embodiment are equivalent to an example of second transfer unit of the invention, and the second and third movable heads 45 and 47 of the device transfer unit 40 and the device conveying unit 50B of this embodiment are equivalent to an example of a second electronic device transfer apparatus of the invention.

Figure 15E:
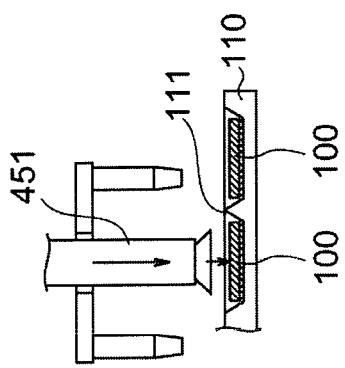
Figure 15D:
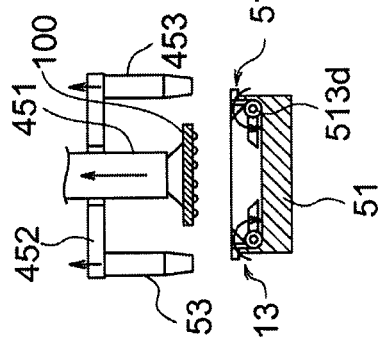
Figure 15C:
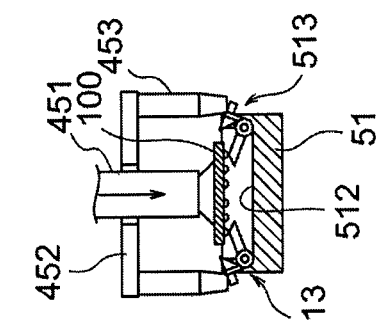
Figure 15B:
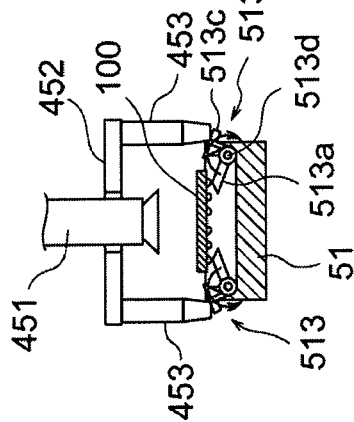

Specifically, the second movable head 45 will be described as an example. First, the second movable head 45 opens the latches 513 by moving only the latch opener 452 down and pressing the contact portions 513c of the latches 513 of the shuttle 51 by protrusions 453 (FIG. 15B). At this time, the first holding portions 513a of the latches 513 push the DUT 100 up. Next, only the suction heads 451 moves down, the DUTs 100 are held by suction (FIG. 15C), and the suction heads 451 moves up. After that, the second movable head 45 moves the latch opener 452 up (FIG. 15D). Next, after the second movable head 45 is moved above the customer tray 110, the second movable head 45 moves the suction heads 451 down and places the DUTs 100 in the receiving portions 111 of the customer tray 110 (FIG. 15E).

In the transfer of the DUTs 100 in this unloader section 90, various test results are allocated to the six tested tray stockers 22 of the storage section 20, respectively, and the second and third movable heads 45 and 47 transfer the DUTs 100 to the customer trays 110 corresponding to the test results of the DUTs 100. As a result, the DUTs 100 are classified on the basis of the test results.

After the DUTs 100 are carried out of all the shuttles 51 that are charged between the stopper 539 and the contact block 538 in the device conveying unit 50B, the first feeder 53 moves all the shuttles 51 in a lump by pushing the rearmost shuttle 51 through the next empty shuttle 51. The shuttles 51, which are pushed to the first inverted portion 521c by the first feeder 53, are moved from the first inverted portion 521c to the second horizontal portion 521b by their own weight.

As described above, in this embodiment, it is possible to sequentially convey the DUTs 100 by revolving a plurality of shuttles 51 on the endless first guide rail 521 when the DUTs 100 are transferred between the customer tray 110 and the test tray 120. Accordingly, it is possible to improve the capacity of transferring the DUTs 100 between the trays 110 and 120.

In contrast to this, when DUTs are transferred between trays by the pick-and-place unit in the related art, while a head of the pick-and-place unit returns to one tray to pick up a DUT, the other tray waits. Accordingly, the improvement of the capacity of transferring the DUTs is limited.

Further, in this embodiment, the first guide rail 521 includes the inverted portions 521c and 521d that are turned back in the vertical direction. Accordingly, it is possible to invert the DUT 100 at the same time with the operation for transferring the DUT 100 between the trays 110 and 120. For this reason, it is possible to simplify the structure of the electronic device testing apparatus 1 where the test head 2 is disposed above the handler 10. Meanwhile, since the test head 2 is disposed above the handler 10, it is possible to increase a degree of freedom in the size of the test head 2.

Furthermore, in this embodiment, the pitch of the DUTs 100 is changed from $P_1$ into $P_2$ when the third feeder 55 receives the shuttles 51 from the second feeder 54 in the loader section 30 or the unloader section 90. Accordingly, even though a shuttle revolving system is employed in the transfer of the DUTs 100 between the trays 110 and 120, it is possible to change the pitch of the DUTs 100 at the same time with the transfer of the DUTs 100.

Meanwhile, the above-mentioned embodiment is described for the easy understanding of the invention, and does not limit the invention. Accordingly, the respective elements disclosed in the above-mentioned embodiment also include all design changes or equivalents within the scope of the invention.

What is claimed is:
1. A conveying carrier, at least one of which is provided to a guide rail of a device conveying unit for conveying a device under test (DUT) and transferring the DUT between first and second trays on which receiving sections for receiving DUTs provided on the first tray are provided at different pitches than receiving sections for receiving DUTs provided on the second tray, comprising:
- a device holder for holding the DUT,
- a base on which the device holder is mounted and is guided along with the guide rail, wherein:
- when the conveying carrier comes into contact with another conveying carrier on the guide rail, a pitch of the conveying carriers is an integer multiple of a pitch of the receiving sections provided on the first tray, and
- the pitch of the conveying carriers is variable on the guide rail while the conveying carriers move on the guide rail between the first tray and the second tray.

2. The conveying carrier according to claim 1, wherein the device holder includes a holding restraint that restrains the DUT.

3. The conveying carrier according to claim 2, wherein the holding restraint is opened by a contact being pressed and releases the DUT.

4. The conveying carrier according to claim 3, wherein
- the device holder includes a device receiving hole that receives the DUT, and
- the holding restraint restrains the DUT in the device receiving hole.

5. The conveying carrier according to claim 2, wherein:
the device holder (i) loads the DUT that is transferred from the first tray with an attitude where terminals of the DUT are directed downward, and transfers the DUT to the second tray by releasing the DUT with an attitude where terminals of the DUT are directed upward or (ii) loads the DUT that is transferred from the first tray with an attitude where terminals of the DUT are directed upward, and transfers the DUT to the second tray by releasing the DUT with an attitude where terminals of the DUT are directed downward.

6. The conveying carrier according to claim 1, wherein the base engages with a feeder that moves the conveying carrier along the guide rail.

7. The conveying carrier according to claim 1, wherein the base includes a bearing for moving the conveying carrier along the guide rail.

8. The conveying carrier according to claim 1, wherein the base includes a rail receiving groove, into which the guide rail is inserted.

9. The conveying carrier according to claim 8, wherein the base includes at both sides thereof a pair of the rail receiving grooves, into which a pair of the guide rails is inserted.

10. The conveying carrier according to claim 8, wherein the rail receiving groove floats the conveying carrier from the guide rail with a pressed air interposed between the rail receiving groove and the guide rail, the pressured air is discharged from an outlet of the guide rail.

11. A device conveying unit comprising:
- a plurality of the conveying carriers according to claim 1,
- the guide rail for guiding the plurality of the conveying carriers.

12. The device conveying unit according to claim 11, further comprising the first tray on which the receiving sections are provided.

* * * * *